(12) United States Patent
Saito et al.

(10) Patent No.: US 8,809,478 B2
(45) Date of Patent: Aug. 19, 2014

(54) SILICON-CONTAINING CURABLE COMPOSITION, CURED PRODUCT OF THE SILICON-CONTAINING CURABLE COMPOSITION AND LEAD FRAME SUBSTRATE FORMED OF THE SILICON-CONTAINING CURABLE COMPOSITION

(75) Inventors: Masako Saito, Tokyo (JP); Ichiro Hiratsuka, Tokyo (JP); Masahiro Wada, Tokyo (JP); Ryota Chiba, Tokyo (JP); Takuya Kanazawa, Tokyo (JP); Osamu Yoshioka, Tokyo (JP); Takehito Tsukamoto, Tokyo (JP); Junko Toda, Tokyo (JP)

(73) Assignee: Adeka Corporation, Tokyo (JP)

( * ) Notice: Subject to any disclaimer, the term of this patent is extended or adjusted under 35 U.S.C. 154(b) by 0 days.

(21) Appl. No.: 13/700,370

(22) PCT Filed: Jun. 6, 2011

(86) PCT No.: PCT/JP2011/062967
§ 371 (c)(1),
(2), (4) Date: Nov. 27, 2012

(87) PCT Pub. No.: WO2011/155459
PCT Pub. Date: Dec. 15, 2011

(65) Prior Publication Data
US 2013/0075154 A1    Mar. 28, 2013

(30) Foreign Application Priority Data
Jun. 11, 2010    (JP) .................................. 2010-133878

(51) Int. Cl.
| | | |
|---|---|---|
| *C08G 77/08* | (2006.01) | |
| *C08L 83/04* | (2006.01) | |
| *H01L 23/057* | (2006.01) | |
| *H01L 23/498* | (2006.01) | |
| *C08L 83/06* | (2006.01) | |
| *C08K 5/14* | (2006.01) | |
| *C08K 5/549* | (2006.01) | |
| *H01L 33/56* | (2010.01) | |
| *C08K 5/5425* | (2006.01) | |
| *C08K 5/00* | (2006.01) | |
| *C08G 77/20* | (2006.01) | |
| *C08G 77/12* | (2006.01) | |

(52) U.S. Cl.
CPC . *C08L 83/06* (2013.01); *C08K 5/14* (2013.01); *C08K 5/549* (2013.01); *H01L 33/56* (2013.01); *H01L 2224/48091* (2013.01); *C08L 83/04* (2013.01); *H01L 2224/45144* (2013.01); *H01L 23/057* (2013.01); *H01L 23/49861* (2013.01); *C08K 5/5425* (2013.01); *C08K 5/0025* (2013.01); *H01L 2224/73265* (2013.01); *C08G 77/20* (2013.01); *C08G 77/12* (2013.01)

USPC .................. 528/24; 528/43; 528/32; 528/31; 524/730; 524/731; 524/588

(58) Field of Classification Search
USPC ............ 528/24, 35, 32, 43, 31; 524/730, 731, 524/588; 428/447
See application file for complete search history.

(56) References Cited

U.S. PATENT DOCUMENTS

| | | | |
|---|---|---|---|
| 5,645,941 A | 7/1997 | Meguriya et al. | |
| 7,651,887 B2 | 1/2010 | Morita et al. | |
| 7,781,522 B2 | 8/2010 | Morita et al. | |
| 7,799,887 B2* | 9/2010 | Omi et al. ........................ | 528/31 |
| 7,951,894 B2 | 5/2011 | Ou | |
| 8,110,637 B2 | 2/2012 | Ono | |
| 8,277,945 B2* | 10/2012 | Anderson et al. .............. | 428/429 |
| 8,476,380 B2 | 7/2013 | Ono | |
| 2004/0116640 A1 | 6/2004 | Miyoshi | |
| 2005/0038221 A1* | 2/2005 | Tabei et al. ...................... | 528/35 |
| 2005/0212008 A1 | 9/2005 | Miyoshi | |
| 2007/0225437 A1 | 9/2007 | Morita et al. | |
| 2008/0070333 A1 | 3/2008 | Morita et al. | |
| 2008/0255304 A1* | 10/2008 | Nakashima et al. .......... | 525/100 |
| 2009/0005479 A1 | 1/2009 | Ou | |
| 2009/0012256 A1 | 1/2009 | Omi et al. | |
| 2009/0088523 A1 | 4/2009 | Ono | |
| 2012/0052309 A1* | 3/2012 | Fairbank ....................... | 428/427 |
| 2012/0101228 A1 | 4/2012 | Ono | |

FOREIGN PATENT DOCUMENTS

| | | |
|---|---|---|
| CN | 1875071 | 12/2006 |
| CN | 101341216 | 1/2009 |
| CN | 101343365 | 1/2009 |
| CN | 101475689 | 7/2009 |

(Continued)

OTHER PUBLICATIONS

International Search Report, PCT/JP2011/062967, Sep. 20, 2011.

*Primary Examiner* — Margaret Moore
(74) *Attorney, Agent, or Firm* — Young & Thompson

(57) ABSTRACT

A curable composition includes: 100 parts by mass of a silicon-containing polymer having a Mw of 3,000 to 100,000 obtainable by hydrolysis-condensation of an organosilane mixture including $R^1SiX_3$, $R^2SiX_3$, $R^3R^4SiX_2$ and $R^5SiX_3$, the total of $R^2SiX_3$ and $R^3R^4SiX2$ being 5 to 60 mol %, optionally a prepolymer, optionally a cyclic siloxane compound, 0.0001 to 10 parts by mass of an organic peroxide and optionally a metal catalyst, and 10 to 1,500 parts by mass of a filler, wherein $R^1$ is a C2-6 alkenyl group, $R^2$ is a C1-6 alkyl group, $R^3$ and $R^4$ are each a C1-6 alkyl group, $R^5$ is a phenyl group optionally substituted with a C1-6 alkyl group, and X is a C1-6 alkoxy group, one or more of $R^2$ to $R^4$ is a methyl group, f represents a number of 2 to 10, g represents a number of 0 to 8, and n represents 1 or 2.

13 Claims, 7 Drawing Sheets

(56) References Cited

FOREIGN PATENT DOCUMENTS

| | | |
|---|---|---|
| CN | 101693765 | 4/2010 |
| CN | 101715470 | 5/2010 |
| JP | 62-091558 | 4/1987 |
| JP | 6-207104 | 7/1994 |
| JP | 8-073743 | 3/1996 |
| JP | 2003-141931 | 5/2003 |
| JP | 2004-107577 | 4/2004 |
| JP | 2004-186168 | 7/2004 |
| JP | 2004-323591 | 11/2004 |
| JP | 2005-068295 | 3/2005 |
| JP | 2006-093354 | 4/2006 |
| JP | 2007-302828 | 11/2007 |
| JP | 2007-332259 | 12/2007 |
| JP | 2009-120732 | 6/2009 |
| JP | 2009-155442 | 7/2009 |
| JP | 2010-018719 | 1/2010 |
| JP | 2010-100758 | 5/2010 |

\* cited by examiner

SILICON-CONTAINING CURABLE COMPOSITION, CURED PRODUCT OF THE SILICON-CONTAINING CURABLE COMPOSITION AND LEAD FRAME SUBSTRATE FORMED OF THE SILICON-CONTAINING CURABLE COMPOSITION

TECHNICAL FIELD

The present invention relates to a silicon-containing curable composition and a cured product formed by curing the composition. The silicon-containing curable composition and the cured product thereof of the present invention are useful for materials for semiconductors, specifically packages for LEDs and the like, lead frame substrates, and the like.

BACKGROUND ART

Various studies have been done on silicon-containing compounds, and polysiloxane compounds, typically silicone resins, have also been conventionally utilized in industries. However, although silicone resins are excellent in heat resistance properties and flexibility, the uses thereof have been limited due to pollution problems in the production steps of electronic elements and the like since they contain much outgas components (volatile components).

Furthermore, since high performances are required for various materials as used in accordance with the development of techniques in the field of electronic information in recent years, materials that are excellent in heat resistance properties and physical and electrical properties which utilize the advantageous properties of silicon have been studied. Among those, various techniques for producing useful compounds by applying hydrosilylation reaction of silicon compounds are studied. Furthermore, lithography steps are used frequently in the steps for producing elements in the field of electronic information, and thus high base resistance property and solvent resistance property have been gradually required. Therefore, materials that satisfy high heat resistance properties and cracking resistance property simultaneously while retaining high base resistance property and solvent resistance property have been gradually required. In response to these requirements, various silicon-containing curable compositions have been suggested (for example, see Patent Literatures 1 to 7).

However, the techniques as suggested in these literatures respectively had individual features but were not satisfiable from the viewpoints of heat resistance properties, light resistance property, cracking resistance property, coloring property and the like that are required for materials in the recent field of electronic information.

CITATION LIST

Patent Literatures

Patent Literature 1: U.S. Pat. No. 5,645,941
Patent Literature 2: Japanese Patent Application Laid-Open (JP-A) No. 8-73743
Patent Literature 3: JP-A No. 2004-107577
Patent Literature 4: JP-A No. 2005-68295
Patent Literature 5: U.S. Patent Application Publication No. 2009/012256
Patent Literature 6: JP-A No. 2007-332259
Patent Literature 7: JP-A No. 2009-120732

SUMMARY OF INVENTION

Technical Problem

Therefore, the present invention aims at providing a silicon-containing curable composition that is excellent in heat resistance properties, light resistance property, cracking resistance property and mechanical strength and thus useful for electrical and electronic materials and the like.

Solution Means

The present inventors have done intensive studies so as to solve the above-mentioned problem, and consequently focused on the structure and a prepolymer of a specific silicon-containing compound and completed the present invention.

Namely, the present invention (the invention as claimed in claim 1) provides a silicon-containing curable composition containing:

as component (A), 100 parts by mass of a silicon-containing polymer having a weight average molecular weight of 3,000 to 100,000, which is obtainable by hydrolysis-condensation of an organosilane mixture containing 5 to 50 mol % of one or more kind of (a) an organosilane represented by the following formula (1-1), 0 to 50 mol % of one or more kind of (b) an organosilane represented by the following formula (I-2), 0 to 40 mol % of one or more kind of (c) an organosilane represented by the following formula (1-3) and 0 to 50 mol % of one or more kind of (d) an organosilane represented by the following formula (1-4), wherein the total of the organosilane (b) and organosilane (c) is 5 to 60 mol %;

as component (B), 0 to 200 parts by mass of a prepolymer containing two or more Si—H groups in one molecule, which is obtainable by a hydrosilylation reaction of one or more kind selected from (α) a cyclic siloxane compound represented by the following formula (2) and one or more kind selected from (β) a compound represented by the following formula (3) or (3');

as component (C), 0 to 30 parts by mass of a cyclic siloxane compound containing two or more carbon-carbon double bonds having reactivity with Si—H groups in one molecule;

as component (D), 0.0001 to 10 parts by mass of an organic peroxide and 0 to 1.0 parts by mass of a metal catalyst, and as component (E), 10 to 1,500 parts by mass of a filler.

[Chemical Formula 1]

$$R^1SiX_3 \quad (1\text{-}1)$$

$$R^2SiX_3 \quad (1\text{-}2)$$

$$R^3R^4SiX_2 \quad (1\text{-}3)$$

$$R^5SiX_3 \quad (1\text{-}4)$$

wherein $R^1$ is an alkenyl group having 2 to 6 carbon atoms, $R^2$ is an alkyl group having 1 to 6 carbon atoms, and $R^3$ and $R^4$ are each independently an alkyl group having 1 to 6 carbon atoms, an alkenyl group having 2 to 6 carbon atoms or a phenyl group optionally substituted by an alkyl group having 1 to 6 carbon atoms, wherein at least one of $R^2$, $R^3$ and $R^4$ is a methyl group, $R^5$ is a phenyl group optionally substituted by an alkyl group having 1 to 6 carbon atoms, and X is a hydroxyl group, an alkoxy group having 1 to 6 carbon atoms or a halogen atom,

[Chemical Formula 2]

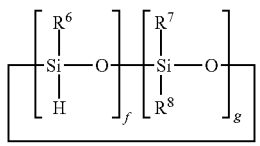

(2)

wherein in the formula (2), $R^6$, $R^7$ and $R^8$ each independently represents an alkyl group having 1 to 6 carbon atoms or a phenyl group optionally substituted by an alkyl group having 1 to 6 carbon atoms, wherein $R^6$s of a number of f may be the same or different and less of a number of g and $R^8$s of a number of g each may also be the same or different, f represents a number of 2 to 10, g represents a number of 0 to 8, and f+g≥2,

[Chemical Formula 3]

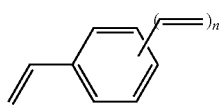

(3)

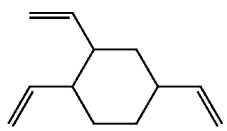

(3')

wherein in the formula (3), n represents 1 or 2.

Furthermore, the present invention (the invention as claimed in claim 2) provides the silicon-containing curable composition according to claim 1, wherein $R^2$ is a methyl group in the formula (1-2), and $R^3$ and $R^4$ are phenyl groups optionally substituted by an alkyl group having 1 to 6 carbon atoms in the formula (1-3).

Furthermore, the present invention (the invention as claimed in claim 3) provides the silicon-containing curable composition according to claim 1, wherein $R^2$ is an alkyl group having 1 to 6 carbon atoms in the formula (1-2), and $R^3$ is an alkyl group having 1 to 6 carbon atoms and $R^4$ is a phenyl group optionally substituted by an alkyl group having 1 to 6 carbon atoms in the formula (1-3).

Furthermore, the present invention (the invention as claimed in claim 4) provides the silicon-containing curable composition according to any one of claims 1 to 3, wherein the content of the component (B) with respect to 100 parts by mass of the component (A) is 10 to 200 parts by mass.

Furthermore, the present invention (the invention as claimed in claim 5) provides the silicon-containing curable composition according to any one of claims 1 to 4, wherein the cyclic siloxane (C) is a cyclic siloxane represented by the following formula (4).

[Chemical Formula 4]

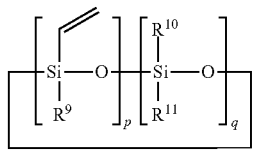

(4)

wherein in the formula (4), $R^9$, $R^{10}$ and $R^{11}$ each independently represents an alkyl group having 1 to 6 carbon atoms or a phenyl group optionally substituted by an alkyl group having 1 to 6 carbon atoms, wherein $R^9$s of a number of p may be the same or different, and less of a number of q and $R^{11}$s of a number of q may also be the same or different, p represents a number of 2 to 10, q represents a number of 0 to 8, and p+q≥2.

Furthermore, the present invention (the invention as claimed in claim 6) provides a cured product obtainable by curing the silicon-containing curable composition according to any one of claims 1 to 5.

Furthermore, the present invention (the invention as claimed in claim 7) provides a lead frame substrate for an LED light emitting device including a lead frame and a resin molded body, wherein the resin molded body is formed of the silicon-containing curable composition according to any one of claims 1 to 5.

Furthermore, the present invention (the invention as claimed in claim 8) provides an LED light emitting device apparatus using the lead frame substrate for an LED light emitting device according to claim 7.

Advantageous Effects of Invention

The present invention can provide a silicon-containing curable composition wherein a cured product obtained therefrom is excellent in heat resistance properties, light resistance property, cracking resistance property and mechanical strength and thus is useful for sealant materials such as packages for LEDs. The silicon-containing curable composition of the present invention is also excellent in curability.

BRIEF DESCRIPTION OF DRAWINGS

FIG. 1 (a2) is a drawing that shows another example of the whole constitution of the lead frame substrate for an LED light emitting device of the present invention.

FIG. 1 (b) is a drawing that shows the rear surface of the lead frame substrate shown in FIG. 1 (a1).

FIG. 1 (c) is a drawing that shows yet another example of the whole constitution of the lead frame substrate for an LED light emitting device of the present invention.

FIG. 2 (2) is a partially enlarged cross-sectional view of the lead frame substrate for an LED light emitting device shown in FIG. 1 (a2).

FIG. 2 (3) is a drawing that shows a modified example of the part shown in FIG. 2 (1).

FIG. 2 (4) is a drawing that shows a modified example of the part shown in FIG. 2 (2).

FIG. 3 (b) is a partially enlarged cross-sectional view that shows the state in which the step of forming a resist pattern has been finished in the production of the lead frame substrate for an LED light emitting device shown in FIG. 1 (a1).

FIG. 3 (c) is a partially enlarged cross-sectional view that shows the state in which the step of forming island parts has been completed in the production of the lead frame substrate for an LED light emitting device shown in FIG. 1 (a1).

FIG. 3 (d) is a partially enlarged cross-sectional view that shows the state in which the step of forming a resin molded body has been completed in the production of the lead frame substrate for an LED light emitting device shown in FIG. 1 (a1).

FIG. 3 (e) is a partially enlarged cross-sectional view of a lead frame substrate for an LED light emitting device obtained after the completion of the step of forming a plating layer in the production of the lead frame substrate for an LED light emitting device shown in FIG. 1 (a1).

FIG. 4 (2) is a drawing that shows a modified example of the LED light emitting device apparatus shown in FIG. 4 (1).

FIG. 4 (3) is a partially enlarged cross-sectional view that shows another example of an LED light emitting device apparatus using the lead frame substrate for an LED light emitting device of the present invention.

DESCRIPTION OF EMBODIMENTS

Figure 1:
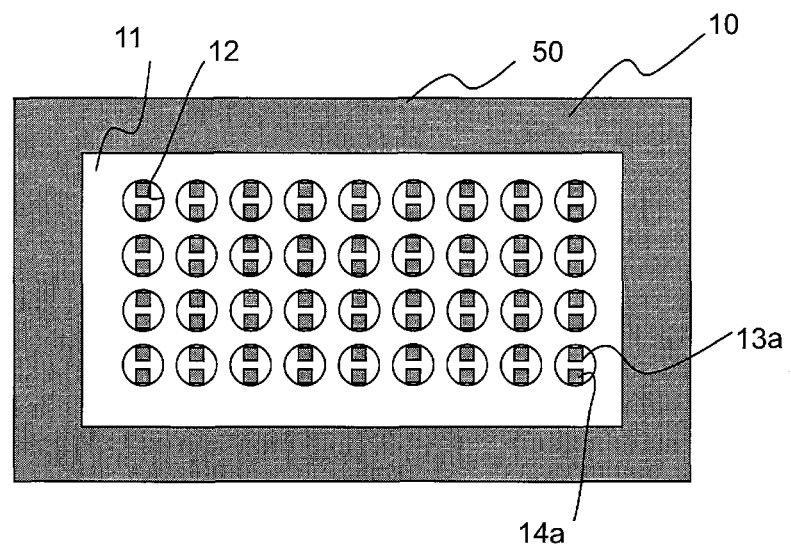
FIG. 1 (a1) is a drawing that shows an example of the whole constitution of the lead frame substrate for an LED light emitting device of the present invention, wherein the drawing shows the surface of the side on which concave parts formed on the lead frame are opened.
Figure 1:
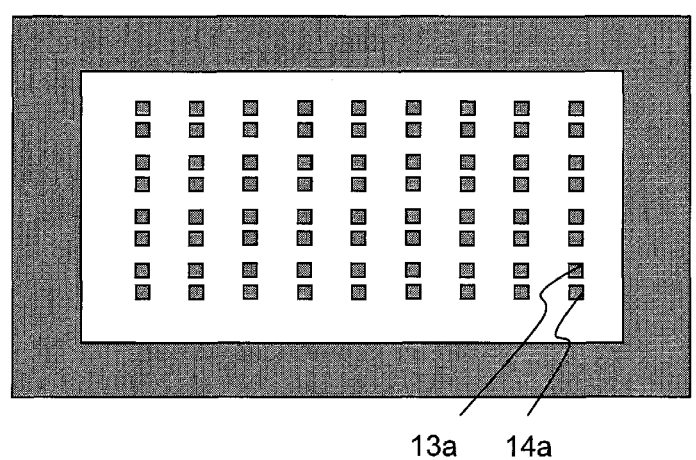
Figure 1B:
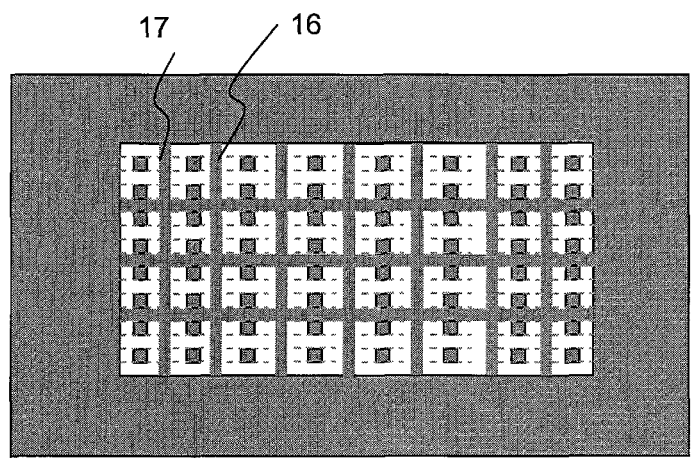
Figure 1C:
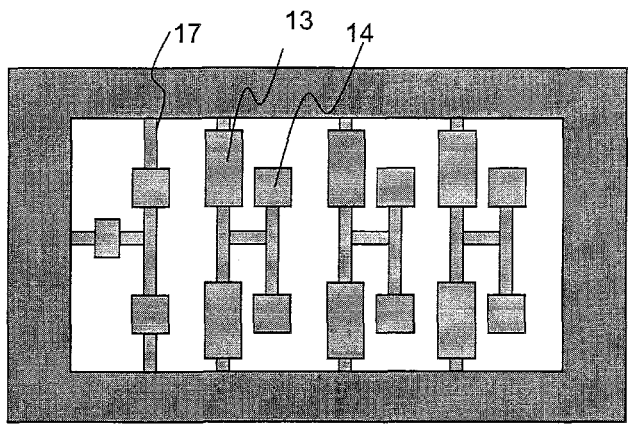

Hereinafter the silicon-containing curable composition and the cured product formed by curing the composition of the present invention will be explained in detail.

First, the silicon-containing polymer that is the above-mentioned component (A) will be explained.

The silicon-containing polymer of the above-mentioned component (A) has a weight average molecular weight in the range of 3,000 to 100,000, preferably in the range of 8,000 to 50,000, more preferably in the range of 15,000 to 25,000 in polystyrene equivalent. When the weight average molecular weight of the silicon-containing polymer is lower than 3,000, desirable physical properties cannot be obtained (decrease in thermal weight loss temperature), whereas when the weight average molecular weight is larger than 100,000, the silicon-containing polymer does not melt at a treatment temperature in transfer molding, or if it melts, the resin has low fluidity at a high viscosity and thus the moldability is decreased.

The silicon-containing polymer of the above-mentioned component (A) can be obtained by hydrolysis-condensation of an organosilane mixture containing 5 to 50 mol % of the organosilane (a) represented by the above-mentioned formula (1-1), 0 to 50 mol % of the organosilane (b) represented by the above-mentioned formula (1-2), 0 to 40 mol % of the organosilane (c) represented by the above-mentioned formula (1-3) and 0 to 50 mol % of the organosilane (d) represented by the above-mentioned formula (1-4), wherein the total of the organosilane (b) and the organosilane (c) is 5 to 60 mol %. In the above-mentioned organosilane mixture, the organosilane (a) is preferably 10 to 40 mol %, the organosilane (b) is preferably 20 to 40 mol %, the organosilane (c) is preferably 10 to 25 mol %, and the organosilane (d) is preferably 5 to 45 mol %. The total of the organosilane (b) and the organosilane (c) is preferably 25 to 55 mol %. Furthermore, it is preferable that the organosilanes included in the above-mentioned organosilane mixture are only four components of the organosilanes (a), (b), (c) and (d).

In the silicon-containing polymer of the above-mentioned component (A), the four kinds of constitutional units represented by $(R^1SiO_{3/2})$, $(R^2SiO_{3/2})$, $(R^3R^4SiO)$ and $(R^5SiO_{3/2})$ that are derived from the organosilanes (a), (b), (c) and (d), respectively, are linked randomly in two or three dimensions, and the terminals thereof are each an OH group or X. X is a group derived from the organosilane (a), (b), (c) or (d).

It is considered that the above-mentioned $(R^1SiO_{3/2})$ also encompasses $(R^1SiX'O_{2/2})$, the above-mentioned $(R^2SiO_{3/2})$ also encompasses $(R^2SiX'O_{2/2})$, and the above-mentioned $(R^5SiO_{3/2})$ also encompasses $(R^5SiX'O_{2/2})$. X' is the same as X included in each of the organosilanes (a), (b) and (d), or represents an OH group.

In the above-mentioned formula (1-1), examples of the alkenyl group having 2 to 6 carbon atoms represented by $R^1$ may include a vinyl group, a 2-propenyl group, a 3-butenyl group and the like. $R^1$ is preferably a vinyl group.

In the above-mentioned formula (1-2), the alkyl group having 1 to 6 carbon atoms represented by $R^2$ may be a straight chain, branched or cyclic alkyl group, and specific examples may include a methyl group, an ethyl group, a propyl group, an isopropyl group, a butyl group, an s-butyl group, a t-butyl group, an isobutyl group, an amyl group, an isoamyl group, a t-amyl group, a hexyl group, a cyclohexyl group and the like. $R^2$ is preferably a methyl group.

In the above-mentioned formula (1-3), examples of the alkyl group having 1 to 6 carbon atoms represented by $R^3$ and $R^4$ and the alkyl group having 1 to 6 carbon atoms by which the phenyl groups represented by $R^3$ and $R^4$ may be substituted may include those exemplified as those represented by the above-mentioned $R^2$. Examples of the alkenyl groups having 2 to 6 carbon atoms represented by $R^3$ and $R^4$ may include those exemplified as those represented by the above-mentioned $R^1$. $R^3$ and $R^4$ are preferably methyl groups.

In the above-mentioned formula (1-4), examples of the alkyl group having 1 to 6 carbon atoms by which the phenyl group represented by $R^5$ may be substituted may include those exemplified as those represented by the above-mentioned $R^2$. $R^5$ is preferably an unsubstituted phenyl group.

In the above-mentioned formulas (1-1) to (1-4), examples of the alkoxy group having 1 to 6 carbon atoms represented by X may include a methoxy group, an ethoxy group, a propoxy group, a butoxy group and the like, and examples of the halogen atom represented by X may include a chlorine atom, a bromine atom, an iodine atom and the like. X is preferably a methoxy group or an ethoxy group. The respective Xs in the above-mentioned formulas (1-1) to (1-4) may be the same or different with each other.

In the case when the above-mentioned four components wherein X is an alkoxy having 1 to 6 carbon atoms (alkoxysilanes) are used, the hydrolysis-condensation reaction of the alkoxysilanes may be a so-called sol-gel reaction that is conducted according to a conventional method, and as the sol-gel reaction, a method including conducting a hydrolysis-condensation reaction with a catalyst such as an acid or base without a solvent or in a solvent may be exemplified. The solvent as used herein is not specifically limited, and specific examples may include water, methanol, ethanol, n-propanol, isopropanol, n-butanol, isobutanol, t-butanol, acetone, methyl ethyl ketone, dioxane, tetrahydrofuran, toluene and the like, and these solvents can be used by one kind or as a mixture of two or more kinds.

The hydrolysis-condensation reaction of the above-mentioned alkoxysilane proceed by generation of silanol groups (Si—OH) by the alkoxysilanes through hydrolysis by water and the condensation of the generated silanol groups or of the silanol groups and alkoxy groups. In order to promote this reaction, it is preferable to add a suitable amount of water, and the water may be added to the solvent, or the catalyst may be dissolved in the water and added. Furthermore, the hydrolysis reaction is also promoted by the moisture in the air or a trace amount of moisture included in the solvent.

The catalyst such as an acid and a base used in the above-mentioned hydrolysis-condensation reaction is not specifically limited as long as it promotes the hydrolysis-condensation reaction, and specific examples may include inorganic acids such as hydrochloric acid, phosphoric acid and sulfuric acid; organic acids such as acetic acid, oxalic acid, p-toluenesulfonic acid and monoisopropyl phosphate; inorganic bases such as sodium hydroxide, potassium hydroxide, lithium hydroxide and ammonia; amine compounds such as trimethylamine, triethylamine, monoethanolamine and diethanolamine; titanium esters such as tetraisopropyl titanate and tetrabutyl titanate; tin carboxylates such as dibutyltin laurate and tin octylate; boron compounds such as trifluoroboron; chlorides of metals such as iron, cobalt, manganese and zinc, metal carboxylates such as naphthenoates or octylates; aluminum compounds such as aluminum trisacetylacetate, and the like, and these can be used by one kind, or two or more kinds can be used in combination.

A method including conducting the above-mentioned hydrolysis-condensation reaction under basic (pH 7 or more) by adding a base catalyst may be exemplified as a preferable example.

When the above-mentioned hydrolysis-condensation reaction is conducted, it is preferable that the reaction system is stirred, and the reaction can be promoted by heating to 40 to 150° C.

The order of the hydrolysis-condensation reaction is not specifically limited, and for example, the hydrolysis-condensation reaction may be conducted by mixing the alkoxysilane having an alkenyl group ($R^1SiX_3$) and other alkoxysilanes ($R^2SiX_3$, $R^3R^4SiX_2$ and $R^5SiX_3$), or it may be possible to conduct a hydrolysis-condensation reaction to some extent for only one kind of alkoxysilane among these four components, add other alkoxysilanes and further conduct the hydrolysis-condensation reaction.

As the above-mentioned four components, the component wherein X is a hydroxyl group and the component wherein X is an alkoxy group may be used in combination, and in this case, the component wherein X is a hydroxyl group can be used without undergoing hydrolysis.

In the case when halogenosilanes (the above-mentioned four components wherein X is a halogen atom) such as chlorosilane are used, the hydrolysis-condensation reaction may be conducted in a similar manner to that in the case of the alkoxysilanes.

In order to obtain the formed silicon-containing polymer from the reaction system in which the above-mentioned hydrolysis-condensation reaction has been completed, it is only necessary to remove the reaction solvent, water and catalyst, and for example, it is only necessary to add a solvent such as butanol to extract the solvent and distill off the extracted solvent under a reduced pressure under a nitrogen flow.

The above-mentioned silicon-containing polymer may be modified and used as the component (A). The modification to which the above-mentioned silicon-containing polymer is subjected is not specifically limited, and various modifications that can be conducted for converting a silicone resin to a reactive silicone resin are possible, and more specifically, the modification can be conducted by a conventional method such as amino-modification, epoxy-modification, carboxy-modification, carbinol-modification, methacrylic-modification, mercapto-modification and phenol-modification.

In the silicon-containing polymer of the above-mentioned component (A), the ratio of the phenyl group in the whole organic components (components except for silicon) is preferably 50 mass % or less, and the ratio of the methyl group is preferably in the range of 85 mass % or less. When the phenyl group is much, the melting point of the silicon-containing polymer is high and the polymer becomes difficult to melt at the temperature during molding, and thus it is difficult to increase the molecular weight of a cured product (polymerized product) during molding; therefore, it is preferable that the methyl group component is much.

Among the above-mentioned component (A), a silicon-containing polymer obtainable by hydrolysis-condensation of an organosilane mixture containing 25 to 45 mol % of the organosilane (a) wherein $R^1$ in the above-mentioned formula (1-1) is a vinyl group, 25 to 45 mol % of the organosilane (b) wherein $R^2$ in the above-mentioned formula (1-2) is a methyl group, 10 to 25 mol % of the organosilane (c) wherein $R^3$ and $R^4$ in the above-mentioned formula (1-3) are methyl groups, and 5 to 20 mol % of the organosilane (d) wherein $R^4$ in the above-mentioned formula (1-4) is a phenyl group is preferable since the obtained silicon-containing polymer has fine tight adhesion property.

Among the above-mentioned component (A), a silicon-containing polymer wherein $R^2$ in the above-mentioned formula (1-2) is a methyl group, and $R^3$ and $R^4$ in the above-mentioned formula (1-3) are phenyl groups optionally substituted by an alkyl group having 1 to 6 carbon atoms is preferable since the silicon-containing polymer is easily synthesized and inexpensive.

Among the above-mentioned component (A), a silicon-containing polymer wherein $R^2$ in the above-mentioned formula (1-2) is an alkyl group having 1 to 6 carbon atoms, and $R^3$ is an alkyl group having 1 to 6 carbon atoms and $R^4$ is a phenyl group optionally substituted by an alkyl group having 1 to 6 carbon atoms in the above-mentioned formula (1-3) is preferable since the silicon-containing polymer has a small linear expansion coefficient.

As the above-mentioned component (A), one kind or two or more kinds of the above-mentioned components can be used.

Next, the prepolymer that is the above-mentioned component (B) will be explained.

The prepolymer of the above-mentioned component (B) has an effect of improving a tight adhesion property against a metal, a resin or the like, and is obtained by a hydrosilylation reaction of one or more kind selected from the above-mentioned component (α) and one or more kind selected from the above-mentioned component (β) and has two or more Si—H groups in one molecule thereof. Although the silicon-containing curable composition of the present invention contains the prepolymer of the above-mentioned component (B) by 0 to 200 parts by mass with respect to 100 parts by mass of the above-mentioned component (A) and thus does not have to contain the above-mentioned component (B), it is preferable that the prepolymer is contained by 10 to 200 parts by mass, further preferably by 30 to 135 parts by mass in view of the above-mentioned effect of improving tight adhesion property.

The component (α) is represented by the above-mentioned formula (2) and is a cyclic siloxane compound containing two or more Si—H groups in one molecule. $R^6$ is preferably a methyl group in view of industrial availability, and $R^7$ and $R^8$ are each preferably a methyl group or a phenyl group. f is preferably 4 to 6 in view of easiness of production, and g is preferably 0 to 1 in view of the crosslinking density of the curing reaction. In the case when both a methyl group and a phenyl group are contained, the ratio of the methyl group to the phenyl group in the whole substituents of $R^6$ to $R^8$ is preferably 4:1 to 1:4.

Specific examples of the component (α) may include 1,3,5,7-tetramethylcyclotetrasiloxane, 1,3,5,7,9-pentamethylcyclopentasiloxane, 1,3,5,7,9,11-hexamethylcyclohexasiloxane and the like, and 1,3,5,7-tetramethylcyclotetrasiloxane is preferable in view of easy industrial availability and a suitable number of Si—H functional groups. The component (α) may be used alone or as a combination of two or more kinds.

The component (β) is a compound represented by the above-mentioned formula (3) or (3').

The compound represented by the above-mentioned formula (3) that is the component (β) represents a divinylbenzene when n is 1 and may be any of o-divinylbenzene, m-divinylbenzene and p-divinylbenzene, or represents a trivinylbenzene when n is 2, and specific examples may include 1,2,3-trivinylbenzene, 1,2,4-trivinylbenzene, 1,3,5-trivinylbenzene and the like. The compound represented by the above-mentioned formula (3) may be one wherein a functional group (for example, an alkyl group such as a methyl group) other than the vinyl group is bound to the benzene ring, or may be a mixture thereof. The component (β) may be used alone or as a combination of two or more kinds.

The prepolymer of the above-mentioned component (B) can be obtained by a hydrosilylation reaction of the above-mentioned component (α) and component (β). The incorporation ratio of the component (α) and the component (β) is not specifically limited as long as two or more Si—H groups are contained in one molecule of the prepolymer of the component (B). Preferably, in view of the viscosity of the prepolymer, the ratio of the number (X) of the Si—H groups in the component (α) and the number (Y) of the carbon-carbon double bonds having reactivity with Si—H groups in the component (β) is preferably X:Y=10:1 to 2:1, more preferably X:Y=4:1 to 2:1.

The concentration of the Si—H groups possessed by the prepolymer of the above-mentioned component (B) is preferably 0.0001 mmol/g to 100 mmol/g, more preferably 0.01 mmol/g to 20 mmol/g from the viewpoints of curability and storage stability.

The prepolymer of the above-mentioned component (B) has a weight average molecular weight of preferably 500 to 500,000, more preferably 1,000 to 300,000 from the viewpoints of heat resistance properties and handling property. The weight average molecular weight of the present prepolymer may be measured by using GPC, and may be obtained by polystyrene equivalent.

It is preferable that the hydrosilylation reaction of the component (α) and component (β) is conducted by using a platinum-based catalyst. The platinum-based catalyst may be a known catalyst containing one or more kind of metal that promotes a hydrosilylation reaction such as platinum, palladium and rhodium. Examples of the platinum-based catalyst that is used as these catalysts for a hydrosilylation reaction may include platinum-based catalysts such as a platinum-carbonylvinylmethyl complex, a platinum-divinyltetramethyldisiloxane complex, a platinum-cyclovinylmethylsiloxane complex and a platinum-octylaldehyde complex, as well as compounds containing palladium, rhodium or the like that is also a platinum-based metal instead of platinum, and these may be used by one kind or as a combination of two or more kinds in combination. Specifically, those containing platinum are preferable in view of curability, and a platinum-divinyltetramethyldisiloxane complex (Karstedt catalyst) and a platinum-carbonylvinylmethyl complex (Ossko catalyst) are specifically preferable. Furthermore, so-called a Wilkinson catalyst that contains the above-mentioned platinum-based metal such as chlorotristriphenylphosphine rhodium (I) is also encompassed in the platinum catalyst in the present invention. The use amount of the platinum catalyst is preferably 5 mass % or less, more preferably 0.0001 to 1.0 mass % of the total amount of the component (α) and component (β) in view of reactivity. Although the condition for the hydrosilylation reaction of the component (α) and component (β) is not specifically limited and may be conducted under a conventionally-known condition by using the above-mentioned catalyst, it is preferable that the reaction is conducted at a room temperature to 130° C. in view of curing velocity, and a conventionally-known solvent such as toluene, xylene, hexane, MIBK (methyl isobutyl ketone), cyclopentanone, PGMEA (propylene glycol monomethyl ether acetate) may be used during the reaction. Furthermore, the above-mentioned catalyst may be removed after the hydrosilylation reaction of the component (α) and component (β) has been conducted, or may be directly used in the silicon-containing curable composition without removing.

The prepolymer of the above-mentioned component (B) is a prepolymer that can be obtained by the hydrosilylation reaction of the component (α) that is the cyclic siloxane compound and the component (β) that is the compound represented by the above-mentioned formula (3) or (3'), and the significant features thereof are that the component (α) that constitutes the component (B) is cyclic, and that a prepolymer is formed by reacting the component (α) and component (β), and the prepolymer is then used as a component to be incorporated in the curable composition. Since the component (α) that constitutes the component (B) has a cyclic structure, the silicon-containing curable composition of the present invention has small curing shrinkability and thus can provide a cured product that is excellent in tight adhesion property. Furthermore, since the silicon content can be increased while keeping a low viscosity, a curable composition that is excellent in heat resistance properties and tight adhesion property can be obtained.

Next, the above-mentioned component (C) will be explained.

The above-mentioned component (C) is a cyclic siloxane copolymer containing two or more carbon-carbon double bonds having reactivity with Si—H groups in one molecule. The cyclic siloxane copolymer may be a random copolymer or a block copolymer. The number of the carbon-carbon double bonds having reactivity with Si—H groups is preferably 2 to 10, more preferably 2 to 6 in view of the crosslinking density of the cured product. Furthermore, examples of the carbon-carbon double bonds having reactivity with Si—H groups may include alkenyl groups such as a vinyl group, and a vinyl group bound to a silicon atom (a Si—CH=$CH_2$ group) is specifically preferable in view of reactivity.

Furthermore, examples of the specifically preferable component (C) in view of the physical properties of the cured product may include a cyclic siloxane copolymer represented by the above-mentioned formula (4).

In the above-mentioned formula (4), $R^9$, $R^{10}$ and $R^{11}$ are each preferably a methyl group or a phenyl group in view of industrial availability. p is preferably 2 to 4 in view of crosslinking density, and q is preferably 1 to 3 in view of viscosity. Specific examples of the preferable component (C) may include cyclic siloxane compounds represented by the following formulas (5) to (7).

[Chemical Formula 5]

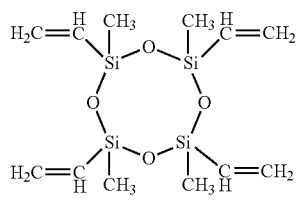

(5)

[Chemical Formula 6]

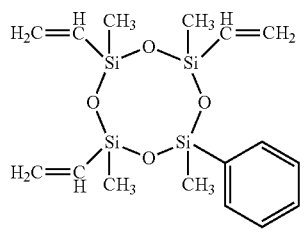

(6)

[Chemical Formula 7]

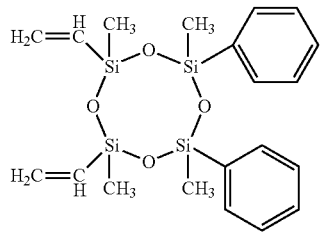

(7)

The above-mentioned component (C) is a cyclic siloxane compound containing two or more carbon-carbon double bonds having reactivity with Si—H groups in one molecule, and since this component (C) is a cyclic siloxane compound, the tight adhesion property is improved. Although the silicon-containing curable composition of the present invention contains the cyclic siloxane copolymer of the above-mentioned component (C) by 0 to 30 parts by mass with respect to 100 parts by mass of the above-mentioned component (A) and thus does not have to contain the above-mentioned component (C), the cyclic siloxane copolymer is included by preferably 0.1 to 25 parts by mass, more preferably 3 to 20 parts by mass in view of the above-mentioned effect of improving tight adhesion property.

Furthermore, in the silicon-containing curable composition of the present invention, the component (A) is preferably 5 to 70 mass %, and the total of the component (B) and component (C) is preferably 0 to 30 mass %, more preferably 1 to 10 mass %.

Furthermore, the contents of the component (B) and component (C) may be suitably determined with consideration for the ratio of the Si—H groups to the carbon-carbon double bonds having reactivity with Si—H groups and the like, and the equivalent amount ratio of the Si—H groups included in the component (B) to the carbon-carbon double bonds having reactivity with Si—H groups included in the component (C) (former/latter) is preferably 0.1 to 10, specifically preferably 1.0 to 5.0.

Next, the organic peroxide that is the above-mentioned component (D) that is a curing accelerator will be explained.

The above-mentioned component (D) activates the methyl groups bound to the silicon atom in the component (A) (Si—$CH_3$ groups), and in the case when methyl groups bound to the silicon atom are present in the component (B) and/or the component (C), further activates those methyl groups, thereby acts as a catalyst that causes a polymerization reaction between these Si—$CH_3$ groups, the alkenyl groups in the component (A), and the carbon-carbon double bonds in the component (C). The organic peroxide of the component (D) is not specifically limited and those generally used in the curing of silicone rubber compositions can be used, and examples may include benzoyl peroxide, o-methylbenzoyl peroxide, p-methylbenzoyl peroxide, o-monochlorobenzoyl peroxide, p-monochlorobenzoyl peroxide, bis-2,4-dichlorobenzoyl peroxide, 2,4-dicumylbenzoyl peroxide, di-t-butylbenzoyl peroxide, t-butylperoxy benzoate, t-butylcumylbenzoyl peroxide, 1,1-bis(t-butylperoxy)-3,3,5-trimethylcyclohexane, 2,5-dimethyl-2,5-bis(t-butylperoxy)hexane, 1,6-bis(t-butylperoxycarboxy)hexane, dichromyl peroxide, dimyristyl peroxycarbonate, t-butylperoxy 2-ethylhexylcarbonate, dicyclododecylperoxy dicarbonate, compounds represented by the following formulas (8) and (8'), and the like. Among these, benzoyl-based peroxide compounds are preferable, and benzoyl peroxide, 2,4-dicumylbenzoyl peroxide and 2,5-dimethyl-2,5-bis(t-butylperoxy)hexane are specifically preferable.

[Chemical Formula 8]

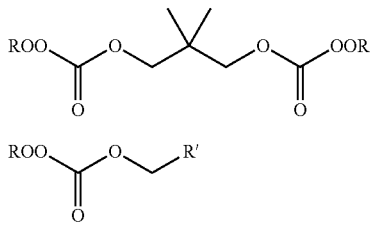

(8)

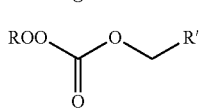

(8')

wherein in the formula (8) and (8'), R, and R' each independently represents a hydrocarbon groups having 3 to 10 carbon atoms.

Examples of the hydrocarbon groups having 3 to 10 carbon atoms represented by R in the above-mentioned formulas (8) and (8') and R' in the above-mentioned formula (8') may include alkyl groups such as propyl, isopropyl, butyl, sec-butyl, tert-butyl, isobutyl, amyl, isoamyl, tert-amyl, hexyl, cyclohexyl, cyclohexylmethyl, 2-cyclohexylethyl, heptyl, isoheptyl, tert-heptyl, n-octyl, isooctyl, tert-octyl, 2-ethylhexyl, nonyl, isononyl and decyl, alkenyl groups such as vinyl, 1-methylethenyl, 2-methylethenyl, propenyl, butenyl, isobutenyl, pentenyl, hexenyl, heptenyl, octenyl, decenyl and 1-phenylpropen-3-yl, alkylaryl groups such as phenyl, 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-tert-butylphenyl, 2,3-dimethylphenyl, 2,4-dimethylphenyl, 2,5-dimethylphenyl, 2,6-dimethylphenyl, 3,4-dimethylphenyl, 3,5-dimethylphenyl and 2,4-ditert-butylphenyl, arylalkyl groups such as benzyl, 2-phenylpropan-2-yl, styryl and cinnamyl and the like, and groups in which these groups are interrupted with an ether bond or thioether bond such as 2-methoxyethyl, 3-methoxypropyl, 4-methoxybutyl, 2-butoxyethyl, methoxyethoxyethyl, methoxyethoxyethoxyethyl, 3-methoxybutyl, 2-phenoxyethyl, 3-phenoxypropyl, 2-methylthioethyl and 2-phenylthioethyl, and these groups are optionally substituted with an alkoxy group, an alkenyl group, a nitro group, a cyano group, a halogen atom or the like.

In the silicon-containing curable composition of the present invention, the content of the organic peroxide that is the above-mentioned component (D) is 0.0001 to 10 parts by mass with respect to 100 parts by mass of the silicon-containing polymer that is the above-mentioned component (A).

Next, the metal catalyst that is the above-mentioned component (D) will be explained.

As the metal catalyst that is the above-mentioned component (D), the platinum-based catalysts that have been exemplified as those can be used in the hydrosilylation reaction of the above-mentioned component (α) and component (β) in obtaining the prepolymer that is the component (B) can be used. As the platinum catalyst, a platinum catalyst that is included in the prepolymer that is the component (B) that can be obtained by the hydrosilylation reaction of the above-mentioned component (α) and component (β) may be used. Furthermore, as the metal catalyst that is the above-mentioned component (D), Al-based, Ti-based and Sn-based metal catalysts such as tris(2,4-pentanedionato)aluminum, Al(acac)$_3$, Al(O-i-Pr)$_3$, Al(ClO$_4$)$_3$, Ti(O-i-Bu)$_4$, Bu$_2$Sn(acac)$_2$ and Bu$_2$Sn(C$_7$H$_{15}$COO)$_2$ can also be used.

Among these, platinum-based catalysts and Al-based catalysts are preferable, and a platinum-carbonylvinylmethyl complex (Ossko catalyst), a platinum-divinyltetramethyldisiloxane complex (Karstedt catalyst) and tris(2,4-pentanedionato)aluminum are specifically preferable.

The metal catalyst of the above-mentioned component (D) has an effect of promoting a hydrosilylation reaction. Although the silicon-containing curable composition of the present invention contains the metal catalyst that is the above-mentioned component (D) by 0 to 1.0 parts by mass with respect to 100 parts by mass of the silicon-containing polymer that is the above-mentioned component (A) and thus does not need to contain the above-mentioned component (D), the component (D) is contained preferably by $1 \times 10^{-4}$ to 0.5 parts by mass, more preferably by $1 \times 10^{-3}$ to 0.2 parts by mass in view of the above-mentioned effect.

Furthermore, in the silicon-containing curable composition of the present invention, the content of the component (D) is preferably 5 mass % or less, more preferably 0.0001 to 3.0 mass % in total of the organic peroxide and metal catalyst from the viewpoints of curability and storage stability. When the content is lower than 0.0001 mass %, curing that sufficiently promotes the reaction of the silicon-containing resin composition cannot be obtained, whereas the obtained effect is not changed even if the amount is more than 5 mass %.

Next, the filler that is the above-mentioned component (E) will be explained.

When the filler is incorporated, the obtained cured product can be colored with a desired color, and the hardness of the obtained cured product can be increased. Preferable examples of the filler may include white pigments and inorganic fillers.

The above-mentioned white pigment is incorporated for increasing whiteness as a white colorant, and for example, titanium dioxide is preferably used. The unit lattice of this titanium dioxide may be any of a rutile type, an anatase type and a brookite type, and a rutile type is preferably used with consideration for light resistance property. Furthermore, although the average particle size and shape are not limited, the average particle size is generally 0.05 to 5.0 μm. The above-mentioned titanium dioxide can be surface-treated in advance with a hydroxide-containing substance of Al, Si or the like so as to increase compatibility and dispersibility with a resin or an inorganic filler.

The average particle size can be obtained as a mass average value $D_{50}$ (or a median diameter) in the measurement of a particle size distribution according to a laser diffractometry.

Furthermore, besides titanium dioxide, potassium titanate, zircon oxide, zinc sulfide, zinc oxide, magnesium oxide, beryllium oxide and the like can be used as the white pigment. Among these, magnesium oxide and zinc oxide are preferable since they can retain a reflectance at a low wavelength (300 to 400 nm). These white pigments may be used alone, or can be used in combination with titanium dioxide.

In the case when the white pigment is used alone as the above-mentioned filler (E), the incorporation amount of the white pigment is 10 to 1,500 parts by mass, preferably 10 to 1,350 parts by mass with respect to 100 parts by mass of the component (A). When the amount is lower than 10 parts by mass, it is possible that sufficient light reflectance cannot be obtained. When the amount exceeds 1,500 parts by mass, a problem that the ratios of other components to be added for improving mechanical strength are decreased occurs. The content of this white pigment is preferably 1 to 90 mass %, more preferably 5 to 85 mass % in the silicon-containing curable resin composition.

As the above-mentioned inorganic filler, those generally incorporated in sealant materials such as silicone resin compositions and epoxy resin compositions can be used. Examples may include silicas such as molten silica, molten spherical silica, crystalline silica, colloidal silica, fumed silica and silica gel; metal oxides such as aluminum oxide (alumina), iron oxide and antimony trioxide; ceramics such as silicon nitride, aluminum nitride, boron nitride and silicon carbide; minerals such as mica and montmorillonite; metal hydroxides such as aluminum hydroxide and magnesium hydroxide, or products obtained by modifying these by an organic modification treatment or the like; metal carbonates such as calcium carbonate, calcium silicate, magnesium carbonate and barium carbonate, or products obtained by modifying these by an organic modification treatment or the like; pigments such as metal borates and carbon black; carbon fibers, graphite, whisker, kaolin, talc, glass fibers, glass beads, glass microspheres, silica glass, laminar clay minerals, clays, silicon carbide, quartz, aluminum, zinc, and the like. In addition, as the filler (E), organic fillers such as acrylic beads, polymer microparticles, transparent resin beads, wood powders, pulp and cotton chips may also be used.

Although the average particle size and shape of these inorganic fillers and organic fillers are not specifically limited, the average particle size is generally 0.1 to 80 μm. The average particle size can be obtained as a mass average value $D_{50}$ (or a median diameter) in the measurement of a particle size distribution by a laser diffractometry.

As the above-mentioned inorganic filler, among the inorganic fillers listed above, silicas, metal oxides, metal carbonates that may be modified, pigments and the like are preferable, and molten silica, molten spherical silica, colloidal silica, aluminum oxide, calcium carbonate, magnesium carbonate, carbon black, kaolin and glass fibers are specifically preferable.

Specifically, molten silica and molten spherical silica are preferably used as the above-mentioned inorganic filler, and although the particle size therefor is not specifically limited, it is preferable that the average particle size is 4 to 40 μm, specifically 7 to 35 μm from the viewpoints of moldability and fluidity. Furthermore, in order to obtain high fluidization, it is desirable to use inorganic fillers having microfine areas of 3 μm or less, medium particle size areas of 4 to 8 μm and coarse areas of 10 to 40 μm in combination.

As the above-mentioned inorganic filler, an inorganic filler that is surface-treated in advance with a coupling agent such as a silane coupling agent and a titanate coupling agent so as to enhance tight adhesion property with metals may be incorporated.

As such coupling agent, it is preferable to use an alkyl-functional alkoxysilane such as dimethyldimethoxysilane, dimethyldiethoxysilane, methylethyldimethoxysilane, methylethyldiethoxysilane, methyltrimethoxysilane, methyltriethoxysilane, ethyltrimethoxysilane and ethyltrimethoxysilane, an alkenyl-functional alkoxysilane such as vinyltrichlorosilane, vinyltrimethoxysilane, vinyltriethoxysilane and allyltrimethoxysilane, an epoxy-functional alkoxysilane such as 3-methacryloxypropyltriethoxysilane, 3-methacryloxypropyltrimethoxysilane, 3-methacryloxypropylmethyldiethoxysilane, 3-methacryloxypropylmethyldimethoxysilane, 2-methacryloxypropyltrimethoxysilane, γ-glycidoxypropyltrimethoxysilane, γ-glycidoxypropylmethyldiethoxysilane and β-(3,4-epoxycyclohexyl)ethyltrimethoxysilane, an amino-functional alkoxysilane such as N-β(aminoethyl)-γ-aminopropyltrimethoxysilane, γ-aminopropyltriethoxysilane and N-phenyl-γ-aminopropyltrimethoxysilane, a mercapto-functional alkoxysilane such as γ-mercaptopropyltrimethoxysilane, a titanium alkoxide such as titanium tetraisopropoxide and titanium tetranormalbutoxide, a titanium chelate such as titanium dioctyloxybis(octylene diglycolate) and titanium diisopropoxybis(ethyl acetoacetate), a zirconium chelate such as zirconium tetraacetyl acetonate and zirconium tributoxy monoacetyl acetonate, a zirconium acylate such as zirconium tributoxy monostearate, an isocyanate silane such as methyl triisocyanate silane, or the like. The incorporation amount of the coupling agent used in the surface treatment and the method for the surface treatment are not specifically limited.

In the case when the inorganic filler is used alone as the above-mentioned filler (E), the incorporation amount of the inorganic filler is 10 to 1,500 parts by mass, preferably 300 to 1,200 parts by mass with respect to 100 parts by mass of the component (A). Some cases when the incorporation amount is lower than 10 parts by mass, addition to increase the hardness of the cured product cannot be sufficiently achieved. When the incorporation amount exceeds 1,500 parts by mass, a problem that the ratios of the other components that are added for improving mechanical strength are decreased occurs. The content of the above-mentioned inorganic filler is preferably 90 mass % or less, more preferably 80 mass % or less in the silicon-containing curable composition of the present invention from the viewpoints of heat resistance properties and handling.

In the silicon-containing curable composition of the present invention, the total amount of the above-mentioned filler (E) is 10 to 1,500 parts by mass, preferably 100 to 1,400 parts by mass, and further preferably 300 to 1,350 parts by mass.

In the silicon-containing curable composition of the present invention, it is also preferable to use the above-mentioned white pigment and the above-mentioned inorganic filler in combination.

A compound having a cyanuric acid structure can be added as an adhesion aid to the silicon-containing curable composition of the present invention to improve the tight-adhesion (adhesion) property. Examples of the compound having a cyanuric acid structure may include isocyanuric acid, triallyl cyanurate, 1,3,5-triglycidyl isocyanurate, triallyl isocyanurate, 1-allyl-3,5-diglycidyl isocyanurate, 1,3-diallyl-5-glycidyl isocyanurate, tris(2-hydroxyethyl)isocyanurate, tris(2,3-dihydroxypropyl)isocyanurate, tris(2,3-epoxypropyl)isocyanurate, a compound represented by the following formula (9), a compound obtained by hydrosilylation of a compound represented by the following formula (9) wherein at least one of $R^{12}$ to $R^{14}$ is an alkenyl group having 2 to 6 carbon atoms and a silicon compound having Si—H groups to improve the solubility of the compound in a silicone resin, those described in respective publications such as Japanese Patent No. 2768426, JP-A Nos. 3-261769, 4-139211, 4-139174 and 10-333330, and the like can be used. Furthermore, these compounds may have undergone various modification treatments such as silicone-modification, ethylene oxide-modification and propylene oxide-modification by conventional methods. Among these, triallyl isocyanurate and silicone-modified isocyanuric acid are preferable. In the case when the compound having a cyanuric acid structure is used, the content of the compound in the silicon-containing curable composition of the present invention is preferably 0.0001 to 10 mass %, more preferably 0.01 to 1.0 mass %.

[Chemical Formula 9]

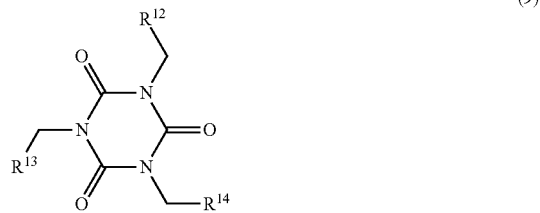

(9)

wherein in the formula (9), $R^{12}$, $R^{13}$ and $R^{14}$ represent an alkyl group having 1 to 10 carbon atoms, an alkenyl group having 2 to 10 carbon atoms or a epoxy group having 2 to 10 carbon atoms.

A free radical scavenger can further be incorporated as an optional component into the silicon-containing curable composition of the present invention. The free radical scavenger in this case may be an antioxidative substance such as antioxidants and stabilizers, and examples may include triethylene glycol-bis[3-(3-t-butyl-5-methyl-4-hydroxyphenyl)propionate], dibutylhydroxytoluene (BHT), 2,6-di-t-butyl-paracresol (DBPC) and the like. The content of the free radical scavenger in the silicon-containing curable composition of the present invention is preferably 0.1 to 50 mass %, more preferably 1 to 30 mass % from the viewpoints of heat resistance properties, electrical properties, curability, dynamic properties, storage stability and handling.

The silicon-containing curable composition of the present invention may further contain a coupling agent as an optional component. When the coupling agent is incorporated, the adhesion property can be improved. As the coupling agent, those exemplified as being able to be used for surface-treating of the above-mentioned inorganic filler can be used. It is preferable to use a silane coupling agent such as an epoxy-functional alkoxysilane, an amino-functional alkoxysilane and a mercapto-functional alkoxysilane, and γ-glycidoxypropyltrimethoxysilane, N-phenyl-γ-aminopropyltrimethoxysilane, N-phenyl-γ-aminoethyltrimethoxysilane and γ-mercaptopropyltrimethoxysilane are preferable. The content of the coupling agent in the silicon-containing curable composition of the present invention is preferably 0.1 to 0.5 mass %, more preferably 0.2 to 0.3 mass %.

Furthermore, other known various resins, releasing agents, additives and the like can also be incorporated into the silicon-containing curable composition of the present invention as optional components other than the above-mentioned adhesion aids, free radical scavengers and coupling agents, within a range in which the performances intended by the present invention are not impaired. Although the use amount of the optional components other than the adhesion aids, free radical scavengers and coupling agents are not specifically limited, it is preferable that the use amount is adjusted to the range of 5 mass % or less in the silicon-containing curable composition of the present invention so as to prevent impairment of the effects of the present invention. In the present invention, various organic functional groups can further be bound to one or more kind of any of the component (A), component (B), component (C), component (D) and component (E) to impart further functions. Furthermore, a highly functional composite material in which the silicon-containing curable composition of the present invention or a cured product is used as a matrix and other useful compounds are dispersed therein can also be prepared.

Examples of the various resins that can be optionally incorporated may include polybutadiene resins and modified products thereof, modified products of acrylonitrile copolymers, polystyrene resins, polyethylene resins, fluorine resins, polyimide resins, polyether resins such as polyethylene glycol, polyphenylene ether and polypropylene glycol, polyurethane resins, epoxy resins, phenol resins, polyester resins, melamine resins, polyamide resins, polyphenylene sulfide resins and the like. Examples of the additives that can optionally be incorporated may include gloss agents, waxes, ultraviolet absorbers, antistatic agents, antioxidants, deterioration preventing agents, modifiers, defoamers, dyes, maleimide compounds, cyanate ester-based compounds, silicone gels, silicone oils and the like.

As the releasing agents, carnauba wax, aliphatic acid esters, glycerin acid esters, stearic acid, montan acid and behenic acid, and metal salts thereof, alkali metal compounds, organic titanium, organic zirconia and organic tin compounds, imidazole compounds, carboxyl group-containing polyolefins, polyethylene-polyoxyethylene resins, carnauba and the like can be used.

Since the silicon-containing curable composition of the present invention is a solid at a room temperature (25° C.), it is excellent in handling property. The silicon-containing curable composition of the present invention may be any shape of powder, granules or tablets, or may be dissolved in a solvent and used. The silicon-containing curable composition of the present invention has a melting point of preferably from 50° C. to 150° C., more preferably from 50° C. to 120° C. or less. The silicon-containing curable composition of the present invention is preferably melted at 50° C. to 150° C., and cured by heat.

Furthermore, a cured product formed of the silicon-containing curable composition of the present invention is specifically excellent in heat resistance properties and tight adhesion property. For the heat resistance properties, specifically, a cured product having a temperature at which 5 mass % of the weight of the cured product has been decreased of 400° C. or more, more preferably 500° C. or more can preferably be obtained. Furthermore, a cured product in which little cracking is generated can preferably be obtained from the silicon-containing curable composition of the present invention.

In the silicon-containing curable composition of the present invention, the curing reaction by the polycondensation reaction between the Si—$CH_3$ groups included in any of the components (A) to (C) and the carbon-carbon double bonds (for example, Si—CH=$CH_2$ groups) proceeds rapidly by the effect of the organic peroxide of the reaction component (D). Furthermore, since the silicon-containing curable composition of the present invention is homogeneous and transparent, it has fine permeability of lights such as ultraviolet ray and can also be cured by light by adding a photoreactive catalyst. It is also possible as a matter of course to further incorporate a photoreactive monomer or resin, and one or more kind of any of the respective components in the silicon-containing curable composition may have a photoreactive group. Furthermore, materials that are excellent in dynamic properties, optical properties, electrical properties and the like such as weather resistance property, hardness, pollution resistance property, flame retardancy, humidity resistance property, gas barrier property, flexibility, stretch, strength, electrical insulation property and low dielectric constant can be obtained from the silicon-containing curable composition of the present invention.

Next, the cured product of the present invention will be mentioned.

The silicon-containing curable composition of the present invention can be cured by heating to form a cured product. This curing reaction may be conducted by any of a method including mixing the components to be incorporated into the silicon-containing curable composition of the present invention immediately before use, and curing the mixture by heating or the like, a method including mixing the whole components in advance, and curing the mixture by heating or the like when conducting a curing reaction, and the like.

The heating temperature in the case when curing is conducted is a temperature at which the resin is melted, for example, preferably 35 to 350° C., and more preferably 50 to 250° C. The curing time is preferably 2 to 60 minutes, more preferably 2 to 10 minutes. Furthermore, annealing or molding can also be conducted after the curing. The treatment time for the annealing differs depending on the temperature, and when the temperature is 150° C., it is preferable to conduct the treatment for about 5 to 60 minutes. By conducting the curing reaction under these curing reaction conditions, a cured product that is excellent in heat resistance properties, durability, tight adhesion property and the like can be obtained from the silicon-containing curable composition of the present invention. As the molding method, known methods such as transfer molding, compression molding and cast molding can be used, and transfer molding is preferable.

It is preferable to conduct transfer molding by using a transfer molding machine under a molding pressure of 5 to 20 N/mm$^2$ at a molding temperature of 120 to 190° C. for 30 to 500 seconds, specifically at 150 to 185° C. for 30 to 180 seconds. The compression molding method is preferably conducted by using a compression molding machine at a molding temperature of 120 to 190° C. for 30 to 600 seconds, specifically at 130 to 160° C. for 120 to 300 seconds. In either molding method, curing can be conducted under conditions of 150 to 185° C. and 2 to 20 hours.

The silicon-containing curable composition of the present invention is excellent in transparency, and the cured product thereof can be utilized as a curable composition that is excellent in various physical properties such as heat resistance properties, light resistance property, cracking resistance property and coloring property. The silicon-containing curable composition and cured product of the present invention can be used as sealant materials for display materials, optical materials, recording materials, printed substrates, semiconductors, solar batteries and the like in the fields of electrical and electronic materials; high-voltage insulating materials, and various materials aiming at insulation, vibration insulation, water repelling or moisture prevention. When the silicon-containing curable composition of the present invention is cured, a film-forming method such as spin casting, potting, dipping and transfer molding can also be suitably applied. Furthermore, the composition can also be applied to uses including test matrices for plastic parts, coating materials, laminar insulation films, prepregs, insulation packings, heat-shrinkable rubber tubes, O-rings, sealants and protecting materials for display devices, optical waveguides, optical fiber protecting materials, optical lenses, adhesives for optical devices, highly heat-resistant adhesives, elastic adhesives, adhesives, die bonding agents, highly heat-radiating materials, highly heat-resistant sealants, elements for solar batteries and fuel batteries, solid electrolytes for batteries, insulation coating materials, photosensitive drums for copying machines, and gas separation films. In addition, typical uses in which the composition can preferably used by applying a technique for transfer molding a white resin may include lead frame substrates in LED packages. Furthermore, the composition can be applied to concrete protecting materials, linings, soil injection agents, sealants, cold-heat storage materials, glass coatings, foamed bodies, coatings and the like in the fields of civil engineering and construction materials, and can also be applied to tubes, sealants, coating materials, sealants for sterilization treatment apparatuses, contact lenses, oxygen enriched films and the like in the field of medical materials. In addition, the composition can also be applied to other films, gaskets, casting materials, various molding materials, sealants for preventing rusting or waterproofing of wired glass, automobile parts, various mechanical parts and the like.

Next, a lead frame substrate for an LED light emitting device of the present invention (hereinafter simply referred to as a lead frame substrate) using the silicon-containing curable composition of the present invention will be explained.

The lead frame substrate for an LED light emitting device of the present invention includes a lead frame and a resin molded body, wherein the resin molded body is formed of the silicon-containing curable composition of the present invention, and can be considered to follow a conventional lead frame substrate for an LED light emitting device except that the above-mentioned resin molded body is formed of the silicon-containing curable composition of the present invention. Hereinafter a preferable exemplary embodiment of the lead frame substrate for an LED light emitting device of the present invention using the silicon-containing curable composition of the present invention will be explained with referring to FIGS. 1 to 4.

FIG. 1 is a drawing showing the whole constitution of an exemplary embodiment of the lead frame substrate of the present invention. As shown in FIG. 1 (a1), a lead frame substrate 10 includes a lead frame 50 on which plural sets of pad part 13 and lead part 14 that are mentioned below are formed, and a resin molded body 11 provided to the lead frame 50. The resin molded body 11 may have a shape having a concave part as in FIG. 2 (1) or an approximately flushed shape in which gaps formed on the lead frame 50 are merely filled with a resin material that comes around the gaps as in FIG. 2 (2). Furthermore, on the rear surface side (second surface) of the pad part 13 and lead part 14, the resin molded body 11 may be approximately flushed with an outer connecting surface and a heat radiating surface as in FIG. 2 (1) and FIG. 2 (2), or may have a shape including bumps where the outer connecting surface (the rear surface of the lead part) and heat radiating surface (the rear surface of the pad part) are exposed as in FIGS. 2 (3) and (4). A plating treatment may be conducted after resin molding as in FIG. 4 (1), or a plating treatment may be conducted before resin molding as in FIG. 4 (2).

The resin molded body 11 is formed of the silicon-containing curable composition of the present invention.

In the case when the silicon-containing curable composition of the present invention is transfer-molded to give a lead frame substrate for an LED light emitting device, one having a bending strength of 40 MPa or more and a linear expansion coefficient of 20 to 40 ppm/° C. is preferably used.

Figure 2:
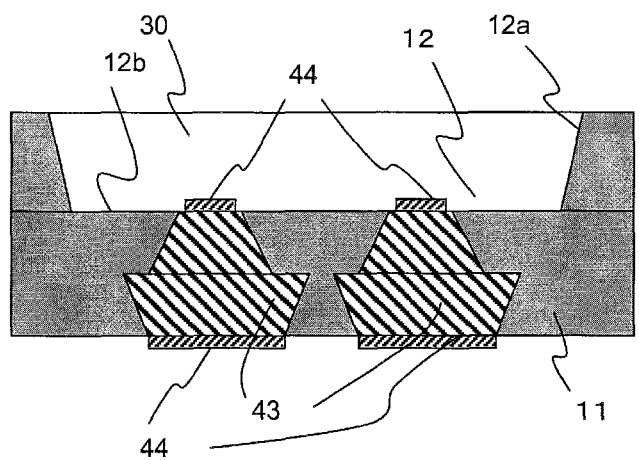
FIG. 2 (1) is a partially enlarged cross-sectional view of the lead frame substrate for an LED light emitting device shown in FIG. 1 (a1).
Figure 2:
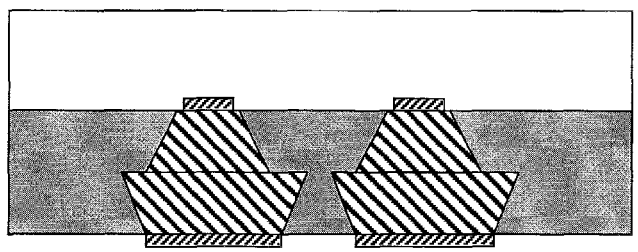
Figure 2:
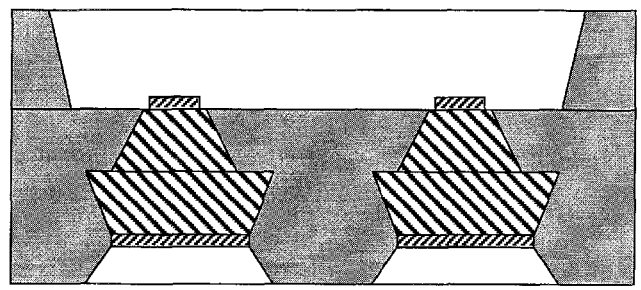
Figure 2:
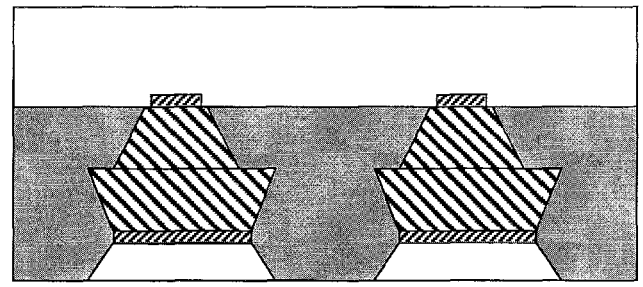
Figure 3A:
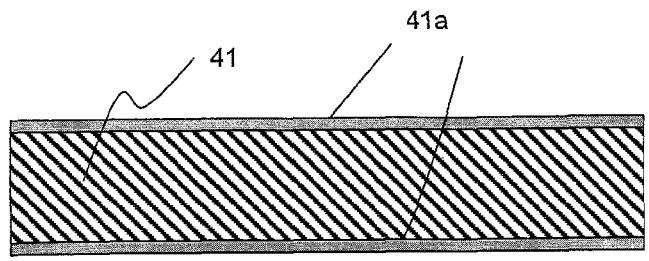
FIG. 3 (a) is a cross-sectional view showing a substrate material to which a resist has been applied which is used for the production of the lead frame substrate for an LED light emitting device shown in FIG. 1 (a1).
Figure 3B:
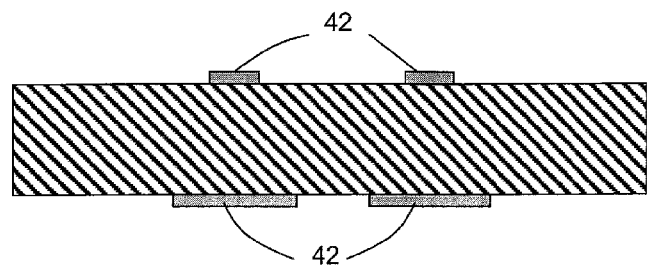
Figure 3C:
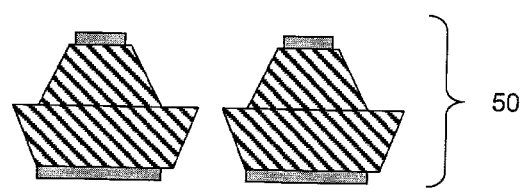
Figure 3D:
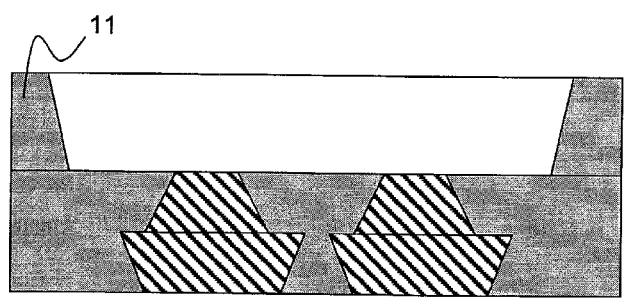
Figure 3E:
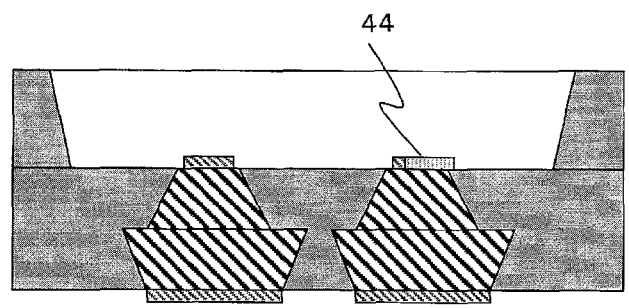

A concave part 12 is also called as a reflector, and in the case when light collection of light emitted from an LED light emitting device is desired by utilizing the side surface of the concave part 12a, a lead frame substrate having the structure of FIG. 2 (1) is used. In the case when diffusion of light emitted from an LED light emitting device is desired, a lead frame substrate having an approximately flushed structure as in the structure of FIG. 2 (2) is used. Therefore, the structure of the lead frame substrate can be selected according to the purpose of use of the LED light emitting device apparatus. The inclination angle (taper angle) of the side surface of the concave part 12a can also be selected freely according to the purpose of use.

Furthermore, when solder connecting with a printed substrate is conducted on the second surface by adjusting the resin surface higher than the outer connection surface (the rear surface of the lead part) and heat radiation surface (the rear surface of the pad part) as in FIGS. 2 (3) and (4), the resin part has an effect to serve as a dam to prevent short circuit between leads. The closer the distance between the leads is, the higher the effect is, and a bump of the resin may be provided depending on the size thereof, and the height thereof can be selected freely.

Figure 4:
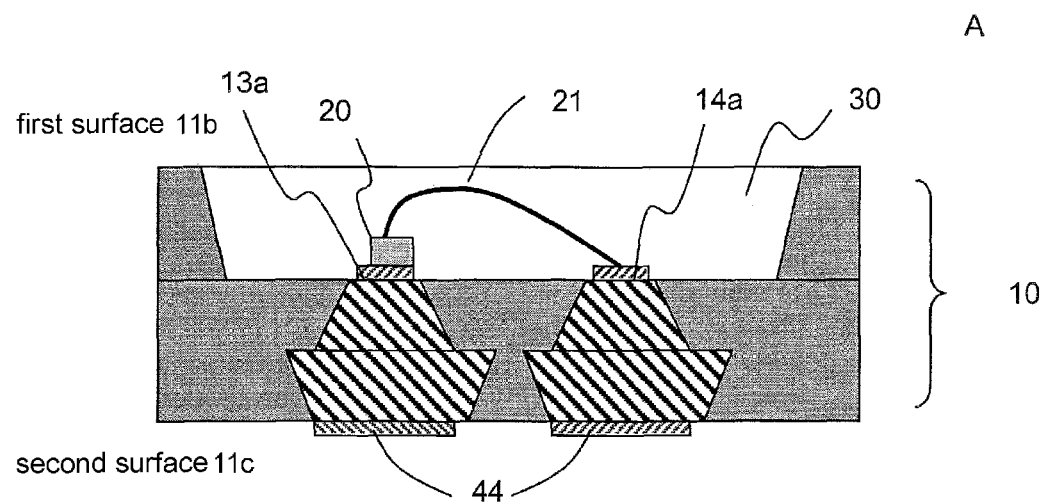
FIG. 4 (1) is a partially enlarged cross-sectional view of an LED light emitting device apparatus formed by mounting an LED light emitting device on the lead frame substrate for the LED light emitting device shown in FIG. 1 (a1) and sealing the device with a sealant resin.
Figure 4:
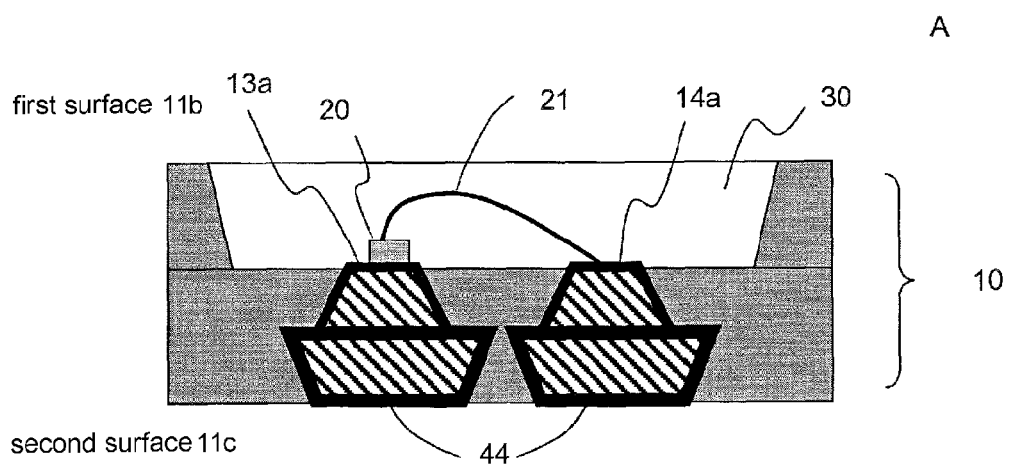
Figure 4:
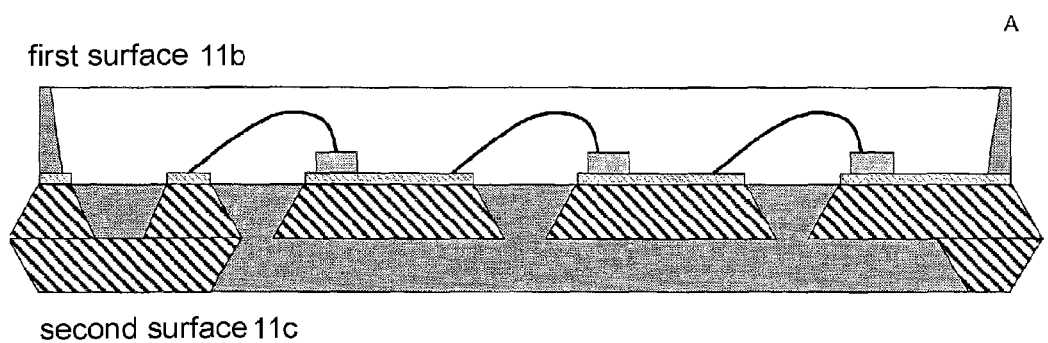

In either shape, plural LED light emitting device apparatuses A can be produced by mounting an LED light emitting device 20 on each pad part 13 on the lead frame substrate 10 as shown in FIG. 4 (1).

FIGS. 2 (1), (2), (3) and (4) are partially enlarged cross-sectional views of the lead frame substrate 10. As shown in FIG. 1 (a1) and FIG. 2 (1), the concave part 12 has, for example, a circle shape in a planar view, and the side surface 12a of the concave part 12 has a tapered shape in which the surface area of the opening is gradually decreased from the side of the first side surface 11b on the side where the concave part 12 opens toward the bottom part 12b of the concave part 12 in the resin molded body 11. In the case when the resin molded body 11 does not have a shape of the concave part 12, the side surfaces of the pad part 13 and lead part 14 are merely filled with a resin material that comes around the pad part 13 and lead part 14 as shown in FIG. 1 (a2) and FIG. 2 (2), and the surface of the resin molded body 11 is positioned on the approximately the same plane as the surface of the pad part 13a and the surface of the lead part 14a.

On the surface of the lead frame substrate 10, irrespective of the shape of the resin molded body 11, the pad part 13 on which the LED light emitting devices 20 is mounted, the surface 13a of the pad part 13 which is electrically connected to the LED light emitting device 20 through a wire 21, solder or the like, and the surface 14a of the lead part 14 are exposed. The lead frame 50 having these pad parts 13 and lead parts 14 has a constitution in which plural sets of island parts 43 that become the pad parts 13 and lead parts 14 are formed by multiple surface mounting by etching a plate-like metal material made of an iron-nickel system or a copper alloy such as copper-nickel-tin, copper-tin, copper-chromium-tin, copper-iron and copper-nickel-silicon-magnesium, or the like in a predetermined shape, and the surfaces of the island parts 43 have undergone a plating treatment such as silver plating, gold plating and palladium plating, or a plating treatment such as silver plating, gold plating, palladium plating, nickel-silver plating and nickel-gold plating. Only the first surface may undergo the plating treatment. Furthermore, the pad part 13 and lead part 14 in each set are formed at an interval, and electrical insulation is provided by interposing a resin material that forms the resin molded body 11 therebetween. In the case of preparation by etching, the rear surface of the pad part 14 can be covered with the resin molded body by half-etching so as to prevent exposing of the metal surface.

As mentioned above, when the plate-like metal material is processed into a predetermined shape, it can be processed into various shapes by using an etching technique, and press processing can also be used depending on the desired shape.

As shown in FIG. 1 (b), in some cases, tie bars 16 that are formed of the same material as those of the pad parts 13 and lead parts 14 are exposed together with the rear surfaces of the pad parts 13 and lead parts 14 on the second surface of the lead frame 50. An embodiment in which hanging leads 17 that are formed of the same material as those of the pad parts 13 and lead parts 14 are formed between the tie bars 16 and the pad parts 13 and lead parts 14, thereby the pad parts 13 and lead parts 14 are held by the metal material may also be used. Alternatively, as shown in FIG. 1 (c), the tie bars each may have an embodiment in which an H-shaped pattern is formed so that a common island for mounting an LED chip which corresponds to an island for a lead and the adjacent other common island that does not correspond to itself is electrically connected.

Furthermore, as shown in FIG. 4 (1), the LED light emitting device 20 is mounted on the surface of the pad part 13a, the surface of the lead part 14a and the LED light emitting device 20 are electrically connected by a metal wire or the like, and a sealant resin 30 for sealing the electrically-connected LED light emitting device 20 is filled on the surface of the lead frame substrate 10. This sealant resin 30 is formed by a resin material having permeability so as to permeate light emitted from the LED light emitting device 20. If necessary, a phosphor may be incorporated in the sealant resin.

FIG. 4 (1) illustrates a singulated state, and when a single piece is cut out from the state in which plural LED light emitting devices are mounted on the lead frame 10 as shown in FIGS. 1 (a1) and (b), the electrical connections of the tie bars 16, the hanging leads 17 and pad parts 13, and the lead parts 14 are killed, and thus the pad part and the lead part become independent.

In such LED light emitting device apparatus A, when the LED light emitting device 20 is energized through the lead part 14, the LED light emitting device 20 emits light. The light permeates the sealant resin 30 and is irradiated toward outside. In the case when the resin molded body 11 forms the concave part 12 as shown in FIG. 1 (a1), a part of the light emitted from the LED light emitting device 20 reflects on the side surface 12a of the concave part 12, permeates the sealant resin 30 and is irradiated toward outside.

The lead frame substrate 10 as mentioned above is formed as follows.

First, as shown in FIG. 3 (a), the surface of a substrate material 41 formed of an alloy thin plate on which a resist 41a is applied is exposed to ultraviolet light by photolithography to form resist patterns 42 on predetermined areas as shown in FIG. 3 (b).

Next, as shown in FIG. 3 (c), island parts 43 are formed on the substrate material 41 by removing parts other than the parts covered with the resist patterns 42 on the substrate material 41 by etching. By using a half etching method as a method for the etching, it is possible to form different shapes of the first surface and the second surface of the island part 43 by using the resist patterns 42 having different shapes on the upper and rear surfaces of the substrate material 41. Therefore, it is also possible to make the shape of the side surface of the island part 43a tapered shape. Thereafter the resist patterns 42 are removed, thereby the lead frame 50 can be obtained.

Next, as shown in FIG. 3 (d), the lead frame 50 formed by the above-mentioned method is housed in a mold that is not depicted, and a resin is filled in this mold from a molding machine to conduct transfer molding to form the resin molded body 11. The resin molded body 11 as formed may have plural concave parts 12, or may have a shape in which the gaps formed on the lead frame 50 are only filled by the resin material that comes around the gaps as shown in FIG. 1 (a2). In either shape, the pad part 13 and lead part 14 are exposed from the resin molded body 11, and the surface of the resin molded body 11 that emerges on the side of the rear surfaces of the pad part 13 and lead part 14 (second surface) may be approximately flushed with the island part, or may have bumps as in FIGS. 2 (3) and (4).

In the transfer molding, the lead frame 10 is disposed in a concave part of a mold (not depicted), wherein the concave part has been formed in advance and has a prescribed inner shape for housing the lead frame 50. The mold has a two-mold constitution including an upper mold that serves as a lid, and a lower mold in which a concave part in which the lead frame 50 can be disposed, which is in communication with an injection port from which the melted resin material is injected is formed, and the upper mold is generally covered with the lower mold and the molds are clamped. At this time, if the lower mold has been processed so as to have bumps, the resin molded body and lead frame can be in a form with bumps.

Next, the heat-melted resin material is injected from the injection port of the mold into the concave part of the mold to give a lead frame for an LED wherein the resin material has been filled and molded in the opening of the lead frame 50 that is disposed in the concave part of the mold. After the molding, the mold is cooled and the upper mold is removed, and the lead frame is taken out of the lower mold. By this way, a lead frame substrate for an LED light emitting device which is molded approximately evenly, in which one surfaces of the island for mounting an LED light emitting device, tie bar and hanging lead are exposed on the surface of the resin molded body 11 and the opening is filled with the resin, is formed.

In addition, since the thicknesses of the tie bar and hanging lead are thin during filling of the material into the lead frame in the mold, the flow of the filled resin is not interrupted and the resin reaches the entirety, thereby formation of air bubbles in the filled resin can be prevented.

During the mold processing of the resin material in a melted state, and after the mold processing, since the filled resin is retained by the bump-like part of the tie bar or the tapered part of the island and thus the contact surface area between the resin material and lead frame is increased, the tight adhesion property is improved, and the dropping off of the lead frame from the resin material or the dropping off of the filled material can be prevented.

As shown in FIG. 3 (e), the exposed parts of the island parts 43 are plated with, for example, silver, thereby plating layers 44 as shown in FIG. 4 (1) are formed on the surfaces thereof. This plating treatment may be conducted before conducing the resin molding as shown in FIG. 4 (2).

In the case when the plating treatment is conducted after the resin molding, plating can be provided to a minimum necessary surface area and the cost can be decreased, whereas in the case of a lead frame substrate including a concave part as in FIG. 2 (1), there is a problem that a plating liquid becomes difficult to enter as miniaturization proceeds. On the other hand, in the case when a plating treatment is conducted before conducting resin molding, the evenness of the thickness of a plated film can be obtained, whereas there is also a problem that the tight adhesion property of the resin becomes insufficient since the molded resin contacts with the plating layer. Therefore, it is necessary to select either depending on the purpose of use of the lead frame substrate for an LED light emitting device.

The transfer-molded resin molded body 11 is subjected to a baking treatment under a prescribed temperature condition to cure the resin, and burrs of the resin molded body 11 that remain on the island part 43 are removed.

By this way, the lead frame substrate for an LED light emitting device 10 is completed.

After that, as shown in FIG. 4 (1), the LED light emitting device 20 is mounted on the pad part 13, and LED light emitting device 20 and the lead part 14 are electrically connected by using the wire 21 by a wire bonding method.

Thereafter a transparent resin is applied by using a dispenser or the like so as to cover the LED light emitting device and metal wire and cured to form a sealant resin 30. Furthermore, a singulated piece is formed from the multiple surface mounting state by using a diamond blade or the like.

Alternatively, by connecting the lead parts in series as shown in FIG. 4 (3), an LED light emitting device apparatus A on which plural LED light emitting devices (three in the drawing) are mounted can be produced without singulation. Furthermore, although the method for mounting an LED light emitting device having two electrodes on the upper surface has been illustrated, the present lead frame substrate can also be mounted in a similar manner on an LED light emitting device having respective electrodes on the upper surface and rear surface.

Although the exemplary embodiments of the present invention have been explained in detail, the present invention is not limited by these embodiments as long as the present invention does not depart from its technical concept, and some modification of designing is also possible.

EXAMPLES

Hereinafter the present invention will further be explained by Examples and Comparative Examples, but the present invention is not construed to be limited by these Examples and the like. The "part (s)" and "%" in Examples are based on mass.

Synthetic Example 1

Synthesis of Component (A): Silicon-Containing Polymer A-1

1.0 mol of phenyltrimethoxysilane, 0.5 mol of vinyltrimethoxysilane, 0.5 mol of methyltrimethoxysilane, 0.25 mol of dimethyldimethoxysilane and 650 g of toluene were put into a 2,000 ml four-necked flask equipped with a cooling tube and a stirring apparatus, 31.4 g of a 0.5% aqueous sodium hydroxide solution was added dropwise over 30 minutes under stirring, and a dehydration polymerization reaction was conducted at 60 to 65° C. for 3 hours. The reactant was cooled to a room temperature, the oil layer was extracted by adding 600 g of toluene and 1,500 g of ion-exchanged water and washed with water until neutral, and the solvent was removed to give 232.6 g of silicon-containing polymer A-1 having a weight average molecular weight of 15,000 (white powder).

Synthetic Example 2

Synthesis of Component (A): Silicon-Containing Polymer A-2

0.25 mol of phenyltrimethoxysilane, 1.0 mol of vinyltrimethoxysilane, 0.9 mol of methyltrimethoxysilane, 0.4 mol of dimethyldimethoxysilane and 650 g of toluene were put into a 2,000 ml four-necked flask equipped with a cooling tube and a stirring apparatus, 31.4 g of a 0.5% aqueous sodium hydroxide solution was added dropwise over 30 minutes under stirring, and a dehydration polymerization reaction was conducted at 60 to 65° C. for 3 hours. The reactant was cooled to a room temperature, the oil layer was extracted by adding 600 g of toluene and 1,500 g of ion-exchanged water and washed with water until neutral, and the solvent was removed to give 198.5 g of silicon-containing polymer A-2 having a weight average molecular weight of 50,000 (white powder).

Synthetic Example 3

Synthesis of Component (A): Silicon-Containing Polymer A-3

0.12 mol of phenyltriethoxysilane, 0.03 mol of vinyltriethoxysilane, 0.09 mol of methyltriethoxysilane, 0.03 mol of dimethyldimethoxysilane and 70 g of toluene were put into a 300 mL four-necked recovery flask, 8 g of a 0.2% aqueous oxalic acid solution was added thereto under stirring, and stirring was conducted at a room temperature for 1 hour. 10 g of a 0.2% aqueous sodium hydroxide solution was added, and a reaction was conducted by stirring at 80° C. for 3 hours. The obtained reaction liquid was washed with water until neutral, and the solvent was removed to give 26 g of silicon-containing polymer A-3 having a weight average molecular weight of 8,000 (white powder).

Synthetic Example 4

Synthesis of Component (A): Silicon-Containing Polymer A-4

0.12 mol of phenyltriethoxysilane, 0.12 mol of vinyltriethoxysilane, 0.08 mol of dimethyldimethoxysilane and 60 mL of toluene were put into a 300 mL four-necked recovery flask, 5 g of a 1% aqueous oxalic acid solution was added under stirring, stirring was conducted at a room temperature for 1 hour, and a reaction was conducted by stirring at 60° C. for 5 hours. The obtained reaction was washed with water until neutral, and the solvent was removed to give 25 g of silicon-containing polymer A-4 having a weight average molecular weight of 9,000 (white powder).

Synthetic Example 5

Synthesis of Component (A): Silicon-Containing Polymer A-5

0.375 mol of phenyltrimethoxysilane, 1.125 mol of vinyltrimethoxysilane, 1.125 mol of methyltriethoxysilane, 0.563 mol of dimethyldimethoxysilane and 1,530 g of methyl isobutyl ketone were put into a 3,000 ml four-necked flask equipped with a cooling tube and a stirring apparatus, 15 g of a 1% aqueous oxalic acid solution was added under stirring, and stirring was conducted under a room temperature for 1 hour. 20 g of a 1% aqueous sodium hydroxide solution was added dropwise under stirring, and a dehydration polymerization reaction was conducted at 70° C. for 5 hours. The obtained reaction liquid was washed with water until neutral, and the solvent was removed to give 253 g of silicon-containing polymer A-5 having a weight average molecular weight of 20,000 (white powder).

Synthetic Example 6

Synthesis of Component (A): Silicon-Containing Polymer A-6

0.085 mol of phenyltrimethoxysilane, 0.139 mol of vinyltrimethoxysilane, 0.24 mol of methyltriethoxysilane, 0.056 mol of dimethyldimethoxysilane, 0.05 mol of diphenylsilanediol and 280 g of methyl ethyl ketone were put into a 1,000 ml four-necked flask equipped with a cooling tube and a stirring apparatus, 30 g of a 0.1% aqueous oxalic acid solution was added under stirring, and stirring was conducted at a room temperature for 1 hour. 40 g of a 0.1% aqueous sodium hydroxide solution was added dropwise under stirring, and a dehydration polymerization reaction was conducted under a reflux condition for 10 hours. The obtained reaction liquid was washed with water until neutral, and the solvent was removed to give 52 g of silicon-containing polymer A-6 having a weight average molecular weight of 20,000 (white powder).

Synthetic Example 7

Synthesis of Component (A): Silicon-Containing Polymer A-7

0.07 mol of phenyltrimethoxysilane, 0.125 mol of vinyltrimethoxysilane, 0.24 mol of methyltrimethoxysilane, 0.065 mol of diphenylsilanediol and 200 g of methyl isobutyl ketone were put into a 1,000 ml four-necked flask equipped with a cooling tube and a stirring apparatus, 20 g of a 0.05% aqueous hydrochloric acid solution was added under stirring, and stirring was conducted at a room temperature for 1 hour. 10 g of a 0.5% aqueous potassium hydroxide solution was added dropwise under stirring, and a dehydration polymerization reaction was conducted under a reflux condition for 5 hours. The obtained reaction liquid was washed with water until neutral, and the solvent was removed to give 52 g of silicon-containing polymer A-7 having a weight average molecular weight of 8,000 (white powder).

Synthetic Example 8

Synthesis of Component (A): Silicon-Containing Polymer A-8

0.05 mol of phenyltrimethoxysilane, 0.15 mol of vinyltrimethoxysilane, 0.225 mol of methyltriethoxysilane, 0.025 mol of dimethyldimethoxysilane, 0.05 mol of diphenylsilanediol and 200 g of xylene were put into a 1,000 ml four-necked flask equipped with a cooling tube and a stirring apparatus, 5 g of a 0.2% aqueous acetic acid solution was added under stirring, and stirring was conducted at a room temperature for 1 hour. 20 g of a 0.2% aqueous sodium hydroxide solution was added dropwise under stirring, and a dehydration polymerization reaction was conducted under a reflux condition for 10 hours. The obtained reaction liquid was washed with water until neutral, and the solvent was removed to give 52 g of silicon-containing polymer A-8 having a weight average molecular weight of 30,000 (white powder).

Synthetic Example 9

Synthesis of Component (A): Silicon-Containing Polymer A-9

0.07 mol of phenyltrimethoxysilane, 0.125 mol of vinyltrimethoxysilane, 0.24 mol of methyltrimethoxysilane, 0.065 mol of diphenylsilanediol and 200 g of methyl ethyl ketone were put into a 1,000 ml four-necked flask equipped with a cooling tube and a stirring apparatus, 20 g of a 0.05% aqueous hydrochloric acid solution was added under stirring, and stirring was conducted at a room temperature for 1 hour. 10 g of a 0.5% aqueous potassium hydroxide solution was added dropwise under stirring, and a dehydration polymerization reaction was conducted under a reflux condition for 5 hours. The obtained reaction liquid was washed with water until neutral, and the solvent was removed to give 44 g of silicon-containing polymer A-9 having a weight average molecular weight of 18,000 (white powder).

Synthetic Example 10

Synthesis of Component (A): Silicon-Containing Polymer A-10

0.05 mol of phenyltrimethoxysilane, 0.15 mol of vinyltrimethoxysilane, 0.225 mol of methyltriethoxysilane, 0.025 mol of dimethyldimethoxysilane, 0.05 mol of diphenylsilanediol and 200 g of toluene were put into a 1,000 ml four-necked flask equipped with a cooling tube and a stirring apparatus, 5 g of a 0.2% acetic acid aqueous solution was added under stirring, and stirring was conducted at a room temperature for 1 hour. 20 g of a 0.2% aqueous sodium hydroxide solution was added dropwise under stirring, and a dehydration polymerization reaction was conducted under a reflux condition for 10 hours. The obtained reaction liquid was washed with water until neutral, and the solvent was removed to give 40 g of silicon-containing polymer A-10 having a weight average molecular weight of 15,000 (white powder).

Synthetic Example 11

Synthesis of Component (A): Silicon-Containing Polymer A-11

0.125 mol of phenyltrimethoxysilane, 0.075 mol of vinyltrimethoxysilane, 0.225 mol of methyltriethoxysilane, 0.025 mol of dimethyldimethoxysilane, 0.05 mol of phenylmethyldimethoxysilane and 200 g of xylene were put into a 1,000 ml four-necked flask equipped with a cooling tube and a stirring apparatus, 5 g of a 0.2% aqueous acetic acid solution was added under stirring, and stirring was conducted at a room temperature for 1 hour. 20 g of a 0.2% aqueous sodium hydroxide solution was added dropwise under stirring, and a dehydration polymerization reaction was conducted under a reflux condition for 10 hours. The obtained reaction liquid was washed with water until neutral, and the solvent was removed to give 40 g of silicon-containing polymer A-11 having a weight average molecular weight of 40,000 (white powder).

Synthetic Example 12

Synthesis of Component (A): Silicon-Containing Polymer A-12

0.48 mol of phenyltrimethoxysilane, 1.28 mol of vinyltrimethoxysilane, 0.96 mol of methyltriethoxysilane, 0.48 mol of dimethyldimethoxysilane and 1,530 g of methyl isobutyl ketone were put into a 3,000 ml four-necked flask equipped with a cooling tube and a stirring apparatus, 15 g of a 1% aqueous oxalic acid solution was added under stirring, and stirring was conducted at a room temperature for 1 hour. 20 g of a 1% aqueous sodium hydroxide solution was added dropwise under stirring, and a dehydration polymerization reaction was conducted at 70° C. for 5 hours. The obtained reaction liquid was washed with water until neutral, and the solvent was removed to give 253 g of silicon-containing polymer A-12 having a weight average molecular weight of 20,000 (white powder).

Synthetic Example 13

Synthesis of Component (A): Silicon-Containing Polymer A-13

0.31 mol of phenyltrimethoxysilane, 0.90 mol of vinyltrimethoxysilane, 0.90 mol of methyltrimethoxysilane, 0.44 mol of dimethyldimethoxysilane and 650 g of toluene were put into a 2,000 ml four-necked flask equipped with a cooling tube and a stirring apparatus, 31.4 g of a 0.5% aqueous sodium hydroxide solution was added dropwise over 30 minutes under stirring, and a dehydration polymerization reaction was conducted at 60 to 65° C. for 3 hours. The reactant was cooled to a room temperature, and the oil layer was extracted by adding 600 g of toluene and 1,500 g of ion-exchanged water and washed with water until neutral, and the solvent was removed to give 79.4 g of silicon-containing polymer A-13 having a weight average molecular weight of 20,000 (white powder).

Synthetic Example 14

Synthesis of Component (A): Silicon-Containing Polymer A-14

0.042 mol of phenyltriethoxysilane, 0.068 mol of vinyltriethoxysilane, 0.1 mol of methyltriethoxysilane, 0.063 mol of dimethyldimethoxysilane and 70 g of toluene were put into a 300 mL four-necked recovery flask, 8 g of a 0.2% aqueous oxalic acid solution was added under stirring, and stirring was conducted at a room temperature for 1 hour. 10 g of a 0.2% aqueous sodium hydroxide solution was added, and a reaction was conducted at 80° C. for 3 hours. The obtained reaction liquid was washed with water until neutral, and the solvent was removed to give 65 g of silicon-containing polymer A-14 having a weight average molecular weight of 20,000 (white powder).

Synthetic Example 15

Synthesis of Component (B): Prepolymer B-1

100 parts of 1,3,5,7-tetramethylcyclotetrasiloxane, 100 parts of divinylbenzene, 60 parts of toluene and 0.0005 part of a platinum-carbonylvinylmethyl complex (Ossko catalyst) were added and refluxed under stirring for 5 hours. The solvent was distilled off from the reaction liquid at 70° C. under a reduced pressure to give prepolymer B-1 that is the component (B).

As a result of an analysis by GPC, the prepolymer B-1 had a molecular weight of Mw=140,000, and the content of hydrosilyl groups (Si—H groups) was 5.3 mmol/g from $^1$H-NMR.

Synthetic Example 16

Synthesis of Component (B): Prepolymer B-2

100 parts of 1,3,5,7-tetramethylcyclotetrasiloxane, 50 parts of divinylbenzene, parts of 1-methoxy-2-propanolacetate and 0.0001 part of a platinum-divinyltetramethyldisiloxane complex (Karstedt catalyst) were added and refluxed under stirring for 6 hours. The solvent was distilled off from the reaction liquid at 50° C. under a reduced pressure to give prepolymer B-2 that is the component (B).

As a result of an analysis by GPC, the prepolymer prepolymer B-2 had a molecular weight of Mw=10,000, and the content of hydrosilyl groups (Si—H groups) was 6.1 mmol/g from $^1$H-NMR.

Synthetic Example 17

Synthesis of Component (B): Prepolymer B-3

100 parts of 1,3,5,7-tetramethylcyclotetrasiloxane, 30 parts of 1,2,4-trivinylcyclohexane, 200 parts of xylene and 0.00001 part of a platinum-carbonylvinylmethyl complex (Ossko catalyst) were added and refluxed under stirring for 6 hours. The solvent was distilled off from the reaction liquid at 50° C. under a reduced pressure to give prepolymer B-3 that is the component (B).

As a result of an analysis by GPC, the prepolymer B-3 had a molecular weight of Mw=8,000, and the content of hydrosilyl groups (Si—H groups) was 7.0 mmol/g from $^1$H-NMR.

Synthetic Example 18

Synthesis of Component (B): Prepolymer B-4

100 parts of 1,3,5,7-tetramethylcyclotetrasiloxane, 50 parts of divinylbenzene, 100 parts of xylene and 0.00005 part of a platinum-divinyltetramethyldisiloxane complex (Karstedt catalyst) were added and refluxed under stirring for 8 hours. The solvent was distilled off from the reaction liquid at 50° C. under a reduced pressure to give prepolymer B-4 that is the component (B).

As a result of an analysis by GPC, the prepolymer B-4 had a molecular weight of Mw=30,000, and the content of hydrosilyl groups (Si—H groups) was 6.0 mmol/g from $^1$H-NMR.

Synthetic Example 19

Synthesis of Component (C): Cyclic Siloxane Compound C-1

A mixture of 210 parts of methylvinyldichlorosilane and 90 parts of phenylmethyldichlorosilane was added dropwise to a mixed liquid obtained by adding 300 parts of 1,4-dioxane and 300 parts of hydrochloric acid and stirring. A reaction was conducted under a room temperature for 30 minutes while the hydrochloric acid that was generated by the hydrolysis reaction was collected, and a reaction was conducted at 70° C. for 3 hours. After the reaction, among the liquid layers separated into two layers, the upper layer was purified by distillation under a condition of 120 to 140° C. under a reduced pressure by a vacuum pump to give cyclic siloxane compound C-1 represented by the above-mentioned formula (6) which is the component (C).

As a result of an analysis by GC-MS, the cyclic siloxane compound C-1 contained the compound having a molecular weight=395 at a surface area ratio of 85% or more, and as a result of an analysis by FT-IR, and the absorption of the hydroxyl group that attributes to the absorption area at 3,200 to 3,600 cm$^{-1}$ was not observed in the cyclic siloxane compound C-1. Furthermore, as a result of an analysis by $^1$H-NMR, the molar ratio of the vinyl group to the phenyl group was found to be a ratio of 3.3:1.0.

Synthetic Example 20

Synthesis of Component (C): Cyclic Siloxane Compound C-2

A mixture of 140 parts of methylvinyldichlorosilane and 180 parts of phenylmethyldichlorosilane were added dropwise to a mixed liquid obtained by adding and stirring 300 parts of 1,4-dioxane and 300 parts of hydrochloric acid. A reaction was conducted under a room temperature for 30 minutes while the hydrochloric acid generated by the hydrolysis reaction was collected, and a reaction was conducted at 70° C. for 3 hours. After the reaction, among the liquid layers separated into two layers, the upper layer was purified by distillation under a condition of 135 to 150° C. under a reduced pressure by a vacuum pump to give cyclic siloxane compound C-2 represented by the above-mentioned formula (7) which is the component (C).

As a result of an analysis by GC-MS, the cyclic siloxane compound C-2 contained the compound having a molecular weight=445 at a surface area ratio of 85% or more, and as a result of an analysis by FT-IR, the absorption of the hydroxyl group that attributes to the absorption area at 3,200 to 3,600 cm$^{-1}$ was not observed in the cyclic siloxane compound C-2. Furthermore, as a result of an analysis by $^1$H-NMR, the molar ratio of the vinyl group to the phenyl group was found to be a ratio of 1.2:1.0.

Synthetic Example 21

Synthesis of Component (C): Cyclic Siloxane Compound C-3

50 parts of the cyclic siloxane compound C-1 obtained in Synthetic Example 19 and 50 parts of the cyclic siloxane compound C-2 obtained in Synthetic Example 20 were mixed to give cyclic siloxane compound C-3 that is the component (C).

Synthetic Example 22

Synthesis of Component (C): Cyclic Siloxane Compound C-4

280 parts of methylvinyldichlorosilane was added dropwise to a mixed liquid obtained by adding 300 parts of 1,4-dioxane and 300 parts of hydrochloric acid and stirring. A reaction was conducted under a room temperature for 30 minutes while the hydrochloric acid that was generated by the hydrolysis reaction was collected, and a reaction was conducted at 70° C. for 3 hours. After the reaction, among the liquid layers separated into two layers, the upper layer was purified by distillation under a condition of 120 or less under a reduced pressure by a vacuum pump to give cyclic siloxane compound C-4 represented by the above-mentioned formula (5) which is the component (C).

As a result of an analysis by GC-MS, the cyclic siloxane compound C-4 had a molecular weight=345, and as a result of an analysis by FT-IR, the absorption of the hydroxyl group that attributes to the absorption area at 3,200 to 3,600 cm$^{-1}$ was not observed in the cyclic siloxane compound C-4. Furthermore, the content of the vinyl group was 11.6 mmol/g from $^1$H-NMR.

Examples 1 to 35 and Comparative Examples 1 to 3

Preparation and Evaluation of Silicon-Containing Curable Compositions

Using the respective compounds obtained in the above-mentioned synthetic examples, silicon-containing curable compositions were obtained by incorporating the silicon-containing polymer (A), the prepolymer (B), the cyclic siloxane compound (C), the organic peroxide and/or metal catalyst (D), the filler (E) and the like at the compositions shown in [Table 1] to [Table5]. For the obtained silicon-containing curable compositions, tests on the heat resistance properties, light resistance property, generation of cracking, mechanical properties and total reflectance were respectively conducted by the methods shown below. In each test, the cured product as a test piece was molded by using a transfer molding machine.

<Test Method>

1. Heat Resistance Properties (Heat Resistance Low Yellowing Property)

A cured product having a diameter of 50 mm×a thickness of 1 mm was molded under conditions of 180° C., 10 MPa and a molding time of 60 seconds, and the Hunter whiteness immediately after the molding was measured. The Hunter whiteness after heating the cured product in an oven at 180° C. for 60 hours was measured, and a value obtained by the following formula was defined as heat resistance low yellowing property.

(Heat resistance low yellowing property)=[(Hunter whiteness after heating)/(Hunter whiteness immediately after molding)]×100

2. Light Resistance Property

A cured product having a diameter of 50 mm×a thickness of 1 mm was molded under conditions of 180° C., 10 MPa and a molding time of 60 seconds, and the light reflectance (total light reflectance) at a wavelength of 450 nm immediately after the molding and the light reflectance at a wavelength of 450 nm after UV irradiation was conducted for 100 hours by using a high pressure mercury lamp were measured by using an ultraviolet spectrometer V550 manufactured by JASCO Corporation, and the light resistance property was obtained from the following formula.

(Light resistance property)=[(light reflectance after UV irradiation)/(light reflectance immediately after molding)]×100

3. Generation of Cracking

A cured product having a diameter of 50 mm×a thickness of 1 mm was molded under conditions of 180° C., 10 MPa and a molding time of 60 seconds, and the cured product was left at 180° C. for 24 hours and the surface thereof was then observed by visual observation.

4. Mechanical Properties
(Bending Strength)

A cured product having a length of 80 mm×a width of 10 mm×a thickness of 1 mm was molded under conditions of 180° C., 10 MPa and a molding time of 60 seconds, and the bending strength was measured according to JIS K7171.

(Linear Expansion Coefficient)

A cured product having a diameter of 5 mm×a thickness of 5 mm was molded under conditions of 180° C., 10 MPa and a molding time of 60 seconds, and an average value from 40° C. to 300° C. was measured by a thermomechanical analysis (TMA).

5. Total Reflectance

A cured product having a diameter of 20 mm×a thickness of 1 mm was molded under conditions of 180° C., 10 MPa and a molding time of 60 seconds, and afterbaked at 160° C. for 2 hours to give a sample piece. The total reflectance at 300 nm to 800 nm of the sample piece was measured by an integrating sphere of an ultraviolet spectrometer.

The results of these tests are shown in [Table 1] to [Table 5]. The Hunter whitenesses described in the following respective tables are Hunter whitenesses at immediately after the molding of the cured products in the tests of 1. Heat resistance property mentioned above.

TABLE 1

| | | | Examples | | | | | | | |
|---|---|---|---|---|---|---|---|---|---|---|
| | | | 1 | 2 | 3 | 4 | 5 | 6 | 7 | 8 |
| Composition (parts by mass) | Silicon-containing polymer (A) | | (A-1) 120 | (A-1) 120 | (A-2) 120 | (A-3) 120 | (A-4) 80 | (A-4) 80 | (A-2) 80 | (A-1) 100 |
| | Prepolymer (B) | | (B-1) 40 | (B-1) 35 | (B-1) 35 | (B-2) 40 | (B-2) 50 | (B-3) 40 | (B-1) 40 | (B-1) 100 |
| | Cyclic siloxane (C) | | — | (C-1) 5 | (C-2) 10 | — | — | — | — | — |
| | Organic peroxide (D) | | (D-1)*[1] 3.5 | (D-1) 5 | (D-1) 2 | (D-1) 6 | (D-1) 4 | (D-1) 4 | (D-1) 1 | (D-4)*[6] 6 |
| | Metal catalyst (D) | | — | — | — | (D-2)*[4] 0.001 | — | — | (D-3)*[5] 0.1 | — |
| | Filler (E) | | (E-1)*[2] 700 | (E-1) 750 | (E-1) 600 | (E-1) 400 | (E-1) 700 | (E-1) 700 | (E-1) 500 | (E-1) 300 |
| | | | (E-2)*[3] 100 | (E-2) 100 | (E-2) 100 | (E-2) 100 | (E-2) 100 | (E-2) 100 | (E-2) 50 | (E-2) 80 |
| | Others | | — | — | — | — | — | — | — | — |
| Test results | Heat resistance properties | Hunter whiteness | 95 | 95 | 95 | 95 | 95 | 96 | 96 | 95 |
| | | Heat resistance low yellowing property | 99 | 100 | 98 | 98 | 98 | 98 | 98 | 98 |
| | Light resistance property (%) | | 99 | 99 | 98 | 99 | 98 | 97 | 99 | 99 |
| | Generation of cracking | | None | None | None | None | None | None | None | None |
| | Mechanical properties | Bending strength (MPa) | 50 | 48 | 50 | 35 | 45 | 46 | 45 | 32 |
| | | Linear expansion coefficient (ppm/° C.) | 19 | 16 | 20 | 22 | 15 | 17 | 21 | 30 |
| | Total reflectance (%) | | 95 | 95 | 95 | 95 | 95 | 95 | 95 | 95 |

*[1] 2,4-Dicumylbenzoyl peroxide
*[2] Molten silica (inorganic filler)
*[3] Titanium dioxide (white pigment)
*[4] Platinum-carbonylvinylmethyl complex (Ossko Catalyst)
*[5] Tris(2,4-pentanedionato)aluminum
*[6] Benzoyl peroxide

TABLE 2

| | | | Examples | | | | | | | |
|---|---|---|---|---|---|---|---|---|---|---|
| | | | 9 | 10 | 11 | 12 | 13 | 14 | 15 | 16 |
| Composition (parts by mass) | Silicon-containing polymer (A) | | (A-4) 80 | (A-1) 80 | (A-1) 80 | (A-1) 80 | (A-1) 80 (A-6)*[7] 30 | (A-1) 80 | (A-1) 120 | (A-1) 120 |
| | Prepolymer (B) | | (B-1) 40 | (B-1) 70 | (B-1) 80 | (B-1) 60 | (B-1) 40 | (B-1) 60 | — | — |
| | Cyclic siloxane (C) | | — | (C-4) 10 | — | — | — | (C-1) 5 | — | (C-2) 5 |
| | Organic peroxide (D) | | (D-1) 4 | (D-1) 4 | (D-1) 5 | (D-1) 5 | (D-1) 3 | (D-1) 6 | (D-1) 3.5 | (D-1) 5 |
| | Metal catalyst (D) | | (D-2) 0.001 | — | — | — | — | (D-2) 0.001 | — | — |

TABLE 2-continued

|  |  |  | Examples | | | | | | | |
|---|---|---|---|---|---|---|---|---|---|---|
|  |  |  | 9 | 10 | 11 | 12 | 13 | 14 | 15 | 16 |
|  | Filler (E) |  | (E-1) 500 (E-2) 100 | (E-3)*8 500 (E-4)*9 100 | (E-4) 600 (E-5)*10 100 | (E-1) 500 (E-2) 100 | (E-1) 700 (E-2) 100 | (E-1) 600 (E-2) 100 | (E-1) 700 (E-2) 100 | (E-1) 750 (E-2) 100 |
|  | Others |  | — | — | — | — | — | (F-1)*11 5 | — | — |
| Test results | Heat resistance properties | Hunter whiteness | 95 | 94 | 95 | 95 | 95 | 96 | 96 | 96 |
|  |  | Heat resistance low yellowing property | 98 | 98 | 98 | 99 | 98 | 99 | 98 | 99 |
|  | Light resistance property (%) |  | 98 | 99 | 98 | 97 | 98 | 100 | 99 | 100 |
|  | Generation of cracking |  | None | None | None | None | None | None | None | None |
|  | Mechanical properties | Bending strength (MPa) | 45 | 50 | 50 | 41 | 38 | 45 | 50 | 51 |
|  |  | Linear expansion coefficient (ppm/° C.) | 20 | 18 | 20 | 19 | 25 | 23 | 19 | 19 |
|  | Total reflectance (%) |  | 95 | 95 | 95 | 95 | 95 | 95 | 95 | 95 |

*7 SILRES H44 (manufactured by Wacker Asahi Kasei Silicone Co., Ltd.; a silicone resin free from alkenyl groups)

*8 Aluminum oxide (inorganic filler)

*9 Calcium carbonate (inorganic filler)

*10 Magnesium oxide (white pigment)

*11 Triallyl isocyanulate (adhesion aid)

TABLE 3

|  |  | Examples | | | | | Comparative Examples | | |
|---|---|---|---|---|---|---|---|---|---|
|  |  | 17 | 18 | 19 | 20 | 21 | 1 | 2 | 3 |
| Composition (parts by mass) | Silicon-containing polymer (A) | (A-1) 60 | (A-1) 120 | (A-1) 120 | (A-2) 120 | (A-3) 120 | (A-2) 80 | (A-6) 60 | (A-6) 60 |
|  | Prepolymer (B) | (B-1) 80 | (B-1) 40 | (B-1) 35 | (B-1) 35 | (B-2) 40 | (B-1) 60 | (B-1) 80 | (B-1) 80 |
|  | Cyclic siloxane (C) | (C-1) 10 | — | (C-1) 5 | (C-2) 10 | — | (C-3) 5 | (C-1) 0 | (C-1) 10 |
|  | Organic peroxide (D) | (D-4) 5 | (D-1) 3.5 | (D-1) 5 | (D-1) 2 | (D-1) 6 | — | (D-1) 5 | — |
|  | Metal catalyst (D) | — | — | — | — | (D-2) 0.001 | (D-3) 0.1 | — | (D-2) 0.001 |
|  | Filler (E) | (E-1) 700 (E-2) 100 | (E-1) 700 (E-2) 100 | (E-1) 750 (E-2) 100 | (E-1) 600 (E-2) 100 | (E-1) 400 (E-2) 100 | (E-1) 600 (E-2) 100 | (E-1) 700 (E-2) 100 | (E-1) 700 (E-2) 100 |
|  | Others | — | (F-2)*12 2.5 | (F-3)*13 2.5 | (F-4)*14 2.5 | (F-5)*15 2.5 | — | — | — |
| Test results | Heat resistance properties | Hunter whiteness | 92 | 95 | 95 | 95 | 95 | 94 | — | 91 |
|  |  | Heat resistance low yellowing property | 90 | 98 | 98 | 98 | 98 | 95 | — | 85 |
|  | Light resistance property (%) | 96 | 97 | 97 | 97 | 97 | 95 | — | 85 |

TABLE 3-continued

|  |  | Examples |  |  |  |  | Comparative Examples |  |  |
|---|---|---|---|---|---|---|---|---|---|
|  |  | 17 | 18 | 19 | 20 | 21 | 1 | 2 | 3 |
|  | Generation of cracking | None | None | None | None | None | Observed | — | Observed |
| Mechanical properties | Bending strength (MPa) | 25 | 45 | 50 | 50 | 51 | 10 | — | 20 |
|  | Linear expansion coefficient (ppm/° C.) | 50 | 20 | 20 | 20 | 20 | 55 | — | 62 |
| Total reflectance (%) |  | 95 | 95 | 95 | 95 | 95 | 95 | 95 | 95 |

*[12] γ-Mercaptopropyltrimethoxysilane (silane coupling agent)
*[13] γ-Glycidoxypropyl trimethoxysilane (silane coupling agent)
*[14] N-Phenyl-γ-aminopropyltrimethoxysilane (silane coupling agent)
*[15] Calcium stearate (releasing agent)

TABLE 4

|  |  |  | Examples |  |  |  |  |  |  |
|---|---|---|---|---|---|---|---|---|---|
|  |  |  | 22 | 23 | 24 | 25 | 26 | 27 | 28 |
| Composition (parts by mass) | Silicon-containing polymer (A) |  | (A-5) 110 | (A-6) 120 | (A-7) 120 | (A-8) 120 | (A-9) 120 | (A-10) 120 | (A-11) 120 |
|  | Prepolymer (B) |  | (B-1) 40 | (B-1) 40 | (B-1) 40 | (B-1) 40 | (B-1) 40 | (B-1) 40 | (B-1) 40 |
|  | Cyclic siloxane (C) |  | — | — | — | — | (D-3) 0.1 | — | — |
|  | Organic peroxide (D) |  | (D-1A)*[14] 0.9 | (D-1A) 1.0 | (D-1A) 3.0 | (D-1A) 0.5 | (D-1A) 2.5 | (D-1A) 3.5 | (D-1A) 1.0 |
|  | Metal catalyst (D) |  | — | — | — | — | — | — | — |
|  | Filler (E) |  | (E-1) 725 (E-2) 98 | (E-1) 700 (E-2) 100 | (E-1) 700 (E-2) 100 | (E-1) 700 (E-2) 100 | (E-1) 700 (E-2) 100 | (E-1) 700 (E-2) 100 | (E-1) 700 (E-2) 100 |
|  | Others |  | (F-5) 2.95 (F-6)*[16] 2.95 | (F-5) 2.95 | — | (F-5) 4.0 | (F-6) 3.5 | (F-5) 5.0 | (F-5) 3.0 (F-6) 2.0 |
| Test results | Heat resistance properties | Hunter whiteness | 98 | 98 | 98 | 99 | 98 | 99 | 98 |
|  |  | Heat resistance low yellowing property | 98 | 97 | 98 | 98 | 97 | 99 | 98 |
|  | Light resistance property (%) |  | 99 | 99 | 99 | 99 | 99 | 99 | 99 |
|  | Generation of cracking |  | None | None | None | None | None | None | None |
|  | Mechanical properties | Bending strength (MPa) | 45 | 44 | 45 | 50 | 50 | 51 | 55 |
|  |  | Linear expansion coefficient (ppm/° C.) | 23 | 20 | 21 | 25 | 20 | 25 | 22 |
|  | Total reflectance (%) |  | 95 | 95 | 95 | 95 | 95 | 95 | 95 |

*[14] 2,5-Dimethyl-2,5-bis(t-butylperoxy)hexane
*[16] LICOWAX E (manufactured by Clariant, releasing agent)

TABLE 5

|  |  | Examples |  |  |  |  |  |  |
|---|---|---|---|---|---|---|---|---|
|  |  | 29 | 30 | 31 | 32 | 33 | 34 | 35 |
| Composition (parts by mass) | Silicon-containing polymer (A) | (A-1) 120 | (A-1) 120 | (A-1) 80 (A-6A)*[6A] 30 | (A-5) 120 | (A-12) 110 | (A-13) 120 | (A-14) 110 |
|  | Prepolymer (B) | (B-4) 40 | (B-2) 40 | (B-1) 40 | (B-1) 40 | (B-1) 40 | (B-1) 40 | (B-1) 40 |
|  | Cyclic siloxane (C) | — | — | — | — | — | — | — |

TABLE 5-continued

|  |  |  | Examples | | | | | | |
|---|---|---|---|---|---|---|---|---|---|
|  |  |  | 29 | 30 | 31 | 32 | 33 | 34 | 35 |
|  | Organic peroxide (D) |  | (D-1) 1.5 | (D-2A)*44 3.5 | (D-1) 1.0 | (D-1A) 0.5 | (D-1A) 0.6 | (D-1A) 0.8 | (D-1A) 0.9 |
|  | Metal catalyst (D) |  | — | — | — | (D-3) 0.1 | — | — | — |
|  | Filler (E) |  | (E-1) 700 (E-2) 100 | (E-1) 700 (E-2) 100 | (E-1) 700 (E-2) 100 | (E-1) 700 (E-2) 100 | (E-1) 735 (E-2) 95 | (E-1) 720 (E-2) 100 | (E-1) 710 (E-2) 95 |
|  | Others |  | (F-5) 2.0 (F-6) 3.0 | (F-6) 2.5 | — | (F-5) 2.5 (F-6) 2.5 | — | (F-5) 2.5 (F-6) 2.5 | (F-5) 2.95 (F-6) 2.95 |
| Test results | Heat resistance properties | Hunter whiteness | 99 | 98 | 98 | 97 | 97 | 97 | 98 |
|  |  | Heat resistance low yellowing property | 98 | 97 | 98 | 99 | 99 | 98 | 98 |
|  | Light resistance property (%) |  | 99 | 99 | 99 | 99 | 99 | 99 | 99 |
|  | Generation of cracking |  | None | None | None | None | None | None | None |
|  | Mechanical properties | 44Bending strength (MPa) | 44 | 45 | 50 | 60 | 46 | 44 | 45 |
|  |  | Linear expansion coefficient (ppm/° C.) | 21 | 22 | 21 | 24 | 23 | 21 | 22 |
|  | Total reflectance (%) |  | 95 | 95 | 95 | 95 | 95 | 95 | 95 |

*44Platinum-divinyltetramethyldisiloxane complex (Karstedt catalyst)
*64SILRES MK Flake (manufactured by Wacker Asahi Kasei Silicone Co., Ltd.)

As is apparent from the results in [Table 1] to [Table 5], the cured products of the silicon-containing curable compositions of the present invention are excellent in heat resistance properties, light resistance property, cracking resistance property, mechanical strength and curability.

In the case when the silicon-containing curable composition of the present invention is transfer-molded to form a lead frame substrate for an LED light emitting device, among the silicon-containing curable compositions described in the above-mentioned Examples, those having a bending strength of 40 MPa or more and a linear expansion coefficient of 20 to 40 ppm/° C. are preferably used.

Example 34

Method for Production of Lead Frame Substrate for LED Light Emitting Device 1

A lead frame substrate for an LED light emitting device 1 according to the present invention was produced by the following method.

First, a plate-like metal material made of a copper-nickel-tin alloy having a thickness of 0.3 mm was prepared and subjected to a degreasing washing treatment, and a negative-type photoresist of 8 μm was applied to the surface of the plate-like metal material and dried at 90° C. for 30 minutes to form a resist layer (FIG. 3 (a)).

Next, in order to form a metal pattern for pad parts on which LED light emitting devices are to be mounted, lead parts that are electrically connected to the LED light emitting devices, tie bars and hanging leads for supporting the pad parts and lead parts, an outer frame part and the like, the photoresist layer was exposed through a photomask having a predetermined pattern by using an ultrahigh pressure mercury lamp at a light exposure amount of about 100 mJ/cm², and the photoresist layer was then subjected to a developing treatment by a 3% sodium carbonate aqueous solution. By this way, a resist pattern was formed on the part corresponding to the above-mentioned pattern, and the resist on other parts was removed (FIG. 3 (b)).

In a similar way, a photoresist was also applied to the rear surface of the plate-like metal material to form a photoresist layer. The above-mentioned steps such as pattern light exposure, developing and the like were repeated. At that time, different shapes of the patterns of the photomasks were used on the upper and rear surfaces so as to set the surface areas of the pad parts and lead parts on the rear surface to be larger than those on the surface for mounting LED light emitting devices after the completion of etching. Furthermore, the hanging lead parts were set so that only the upper surfaces were half-etched.

Next, using a ferric chloride liquid having a specific gravity of 1.45, the exposed parts on the both surfaces of the plate-like metal material were removed at the same time by etching. By this way, a desired lead frame pattern having different shapes of the both surfaces was formed (FIG. 3 (c)).

A resin molded body 11 was disposed on the obtained lead frame 50 by using a mold for filling that is not depicted, by using a solid tablet having a diameter of 18 mm and a length of 40 mm containing the silicon-containing curable composition shown in Example 7. At that time, a prescribed number of circular concave parts each having a depth of 0.5 mm and an inclination having an angle with the surface of the lead frame of 45° were formed on the side of the surface for mounting LED light emitting devices. On the other hand, on the rear surface, the corresponding surfaces of the pad parts, the surfaces of the lead parts and the resin surface were formed on the same plane.

The lead frame substrate was taken out from the mold and cured by heat at 130° C. for 1 hour.

In order to remove resin burr that had exuded on the surfaces of the pad parts and lead parts, electrolytic polishing was conducted by using an aqueous phosphoric acid solution for 30 minutes, and a treatment was then conducted by argon etching (FIG. 3 (d)).

Thereafter, using a silver plating liquid having a silver concentration of 50 g/L, a pH of 8.5, a bath temperature of 65° C., a specific gravity of 1.1, an anode current density of 10 A/dm$^2$ and a liquid flux of 1.0 m/sec, electrolysis silver platings 44 of 4 μM were provided to the surfaces of the pads parts and lead parts of the upper and rear surfaces. No part on which the plating adhered was observed on the surfaces of the pad parts and lead parts, and thus homogeneous plating layers were formed. By this way, the lead frame substrate for an LED light emitting device 1 of the present invention was completed (FIG. 3 (e)).

Example 35

Method for Production of Lead Frame Substrate for LED Light Emitting Device 2

The lead frame substrate for an LED light emitting device 2 according to the present invention was produced by the following method.

First, a plate-like metal material made of a copper-nickel-tin alloy having a thickness of 0.3 mm was prepared and subjected to a degreasing washing treatment, and a negative-type photoresist of 8 μm was applied to the surface of the plate-like metal material and dried at 90° C. for 30 minutes to form a resist layer.

Next, in order to form a metal pattern for pad parts on which LED light emitting devices are to be mounted, lead parts that are electrically connected to the LED light emitting devices, tie bars and hanging leads for supporting the pad parts and lead parts, an outer frame part and the like, the photoresist layer was exposed through a photomask having a predetermined pattern by using an ultrahigh pressure mercury lamp at a light exposure amount of about 100 mJ/cm$^2$, and the photoresist layer was then subjected to a developing treatment by a 3% sodium carbonate aqueous solution. By this way, a resist pattern was formed on the part corresponding to the above-mentioned pattern, and the resist on other parts was removed.

In a similar way, a photoresist was also applied to the rear surface of the plate-like metal material to form a photoresist layer. The above-mentioned steps such as pattern light exposure, developing and the like were repeated. At that time, different shapes of the patterns of the photomasks were used on the upper and rear surfaces so as to set the surface areas of the pad parts and lead parts on the rear surface to be larger than those on the surface for mounting an LED light emitting devices after the completion of etching. Furthermore, the hanging lead parts were set so that only the upper surfaces were half-etched.

Next, using a ferric chloride liquid having a specific gravity of 1.45, the exposed parts on the both surfaces of the plate-like metal material were removed at the same time by etching. By this way, a desired lead frame pattern having different shapes of the both surfaces was formed.

Thereafter, an electrolysis nickel plating of 4 μm was provided to the whole surface of the lead frame by using 300 to 600 g/L of nickel sulfamate, 5 g/L of nickel chloride and 30 to 40 g/L of boric acid, a pH of 3.5 to 4.5, a temperature of 40 to 70° C. and an anode current density of 3 to 40 A/dm$^2$, and using a sulfamic acid bath that had been adjusted by Ni with S and a trace amount of surfactant in an anode, and an electrolysis silver plating of 4 μm was further provided to the whole surface of the lead frame in a similar manner by using a silver plating liquid having a silver concentration of 50 g/L, a pH of 8.5, a bath temperature of 65° C., a specific gravity of 1.1, an anode current density of 10 A/dm$^2$ and a liquid flux of 1.0 msec, and using electrolysis silver platings of 4 μm on the surfaces of the pad part and lead part of the upper and rear surfaces.

A resin molded body 11 was disposed on the obtained lead frame 50 by using a mold for filling that is not depicted, by using a solid tablet having a diameter of 18 mm and a length of 40 mm containing the silicon-containing curable composition shown in Example 14.

At that time, a prescribed number of oval concave parts each having a depth of 0.3 mm and an inclination having an angle with the surface of the lead frame of 45° were formed on the side of the surface for mounting LED light emitting devices. On the other hand, on the rear surface, the corresponding surfaces of the pad parts, the surfaces of the lead parts and the resin surface were formed on the same plane.

The lead frame substrate was taken out from the mold and cured by heat at 130° C. for 1 hour.

In order to remove resin burr that had exuded on the surfaces of the pad parts and lead parts, electrolytic polishing was conducted by using an aqueous phosphoric acid solution for 30 minutes, and a treatment was then conducted by argon etching.

By this way, the lead frame substrate for an LED light emitting device of the present invention was completed.

Example 36

Method for Production of Lead Frame Substrate for LED Light Emitting Device 3

The lead frame substrate for an LED light emitting device 3 according to the present invention was produced by the following method.

First, a plate-like metal material made of a copper-chromium-tin alloy having a thickness of 0.5 mm was prepared and subjected to a degreasing washing treatment, and a negative-type photoresist of 8 μm was applied to the surface of the plate-like metal material and dried at 90° C. for 30 minutes to form a resist layer.

Next, in order to form a metal pattern for pad parts on which LED light emitting devices are to be mounted, lead parts that are electrically connected to the LED light emitting devices, tie bars and hanging leads for supporting the pad parts and lead parts, an outer frame part and the like, the photoresist layer was exposed through a photomask having a predetermined pattern by using an ultrahigh pressure mercury lamp at a light exposure amount of about 100 mJ/cm$^2$, and the photoresist layer was then subjected to a developing treatment by a 3% sodium carbonate aqueous solution. By this way, a resist pattern was formed on the part corresponding to the above-mentioned pattern, and the resist on other parts was removed.

In a similar way, a photoresist was also applied to the rear surface of the plate-like metal material to form a photoresist layer. The above-mentioned steps such as pattern light exposure, developing and the like were repeated. At that time, different shapes of the patterns of the photomasks were used on the upper and rear surfaces so as to set the surface areas of the pad parts and lead parts on the rear surface to be larger than those on the surface for mounting LED light emitting devices after the completion of etching. Furthermore, the hanging lead parts were set so that only the upper surfaces were half-etched.

Next, using a ferric chloride liquid having a specific gravity of 1.45, the exposed parts on the both surfaces of the plate-like metal material were removed at the same time by etching. By this way, a desired lead frame pattern having different shapes of the both surfaces was formed.

A resin molded body 11 was disposed on the obtained lead frame 50 by using a mold for filling that is not depicted, by using a solid tablet having a diameter of 18 mm and a length of 40 mm containing the silicon-containing curable composition shown in Example 22.

At that time, the pad surface parts, the surfaces of the lead parts and the resin surface were formed on the same plane on both of the surface for mounting LED light emitting devices and the rear surface. The melted resin component passed the half-etched parts of the tie bars and hanging leads and reached the whole surface of the lead frame, and there was no problem on the moldability.

The lead frame substrate was taken out from the mold and cured by heat at 130° C. for 1 hour.

In order to remove resin burr that had exuded on the surfaces of the pad parts and lead parts, electrolytic polishing was conducted by using an aqueous phosphoric acid solution for 30 minutes, and a treatment was then conducted by argon etching.

Thereafter electrolysis silver platings of 4 µm were provided to the surfaces of the pad parts and lead parts of the upper and rear surfaces by using a silver plating liquid having a silver concentration of 50 g/L, a pH of 8.5, a bath temperature of 65° C., a specific gravity of 1.1, an anode current density of 10 A/dm$^2$ and a liquid flux of 1.0 msec. No part on which the plating adhered was observed on the surfaces of the pad parts and lead parts, and thus homogeneous plating layers were formed. By this way, the lead frame substrate for an LED light emitting device of the present invention was completed.

Example 37

Method for Production of Lead Frame Substrate for LED Light Emitting Device 4

The lead frame substrate for an LED light emitting device 4 according to the present invention was produced by the following method.

First, a plate-like metal material made of a copper-nickel-magnesium-silicon alloy having a thickness of 0.3 mm was prepared and subjected to a degreasing washing treatment, and a negative-type photoresist of 8 µm was applied to the surface of the plate-like metal material and dried at 90° C. for 30 minutes to form a resist layer.

Next, in order to form a metal pattern for pad parts on which LED light emitting device are mounted, lead parts that are electrically connected to the LED light emitting devices, tie bars and hanging leads for supporting the pad parts and lead parts, an outer frame part and the like, the photoresist layer was exposed through a photomask having a predetermined pattern by using an ultrahigh pressure mercury lamp at a light exposure amount of about 100 mJ/cm$^2$, and the photoresist layer was then subjected to a developing treatment by a 3% sodium carbonate aqueous solution. By this way, a resist pattern was formed on the part corresponding to the above-mentioned pattern, and the resist on other parts was removed.

In a similar way, a photoresist was also applied to the rear surface of the plate-like metal material to form a photoresist layer. The above-mentioned steps such as pattern light exposure, developing and the like were repeated. At that time, different shapes of the patterns of the photomasks were used on the upper and rear surfaces so as to set the surface areas of the pad parts and lead parts on the rear surface to be larger than those on the surface for mounting an LED light emitting device after the completion of etching. Furthermore, the hanging lead parts were set so that only the upper surfaces were half-etched.

Next, using a ferric chloride liquid having a specific gravity of 1.45, the exposed parts on the both surfaces of the plate-like metal material were removed at the same time by etching. By this way, a desired lead frame pattern having different shapes of the both surfaces was formed.

A resin molded body 11 was disposed on the obtained lead frame 50 by using a mold for filling that is not depicted, by using a solid tablet having a diameter of 18 mm and a length of 40 mm containing the silicon-containing curable composition shown in Example 27.

At that time, a prescribed number of circular concave parts each having a depth of 0.5 mm and an inclination having an angle with the surface of the lead frame of 45° were formed on the side of the surface for mounting LED light emitting devices. On the other hand, on the rear surface, concave parts each having a depth of 0.05 µm were formed to expose the corresponding surfaces of the pad parts and lead parts on the bottom surfaces.

The lead frame substrate was taken out from the mold and cured by heat at 130° C. for 1 hour.

In order to remove resin burr that had exuded on the surfaces of the pad parts and lead parts, electrolytic polishing was conducted by using an aqueous phosphoric acid solution for 30 minutes, and a treatment was then conducted by argon etching.

Thereafter, electrolysis nickel platings of 4 µm were provided to the surfaces of the pad parts and lead parts on the upper and rear surfaces by using 300 to 600 g/L of nickel sulfamate, 5 g/L of nickel chloride, 30 to 40 g/L of boric acid, a pH of 3.5 to 4.5, a temperature of 40 to 70° C. and an anode current density of 3 to 40 A/dm$^2$, and using a sulfamic acid bath that had been adjusted by Ni with S and a trace amount of surfactant in an anode, and using an electrolysis nickel plating of 4 µm on the whole surface of the lead frame, and electrolysis gold platings of 4 µm were provided similarly to the surfaces of the pad parts and lead parts on the upper and rear surfaces. No part on which the plating adhered was observed on the surfaces of the pad parts and lead parts, and thus homogeneous plating layers were formed. By this way, the lead frame substrate for an LED light emitting device of the present invention was completed.

Example 38

Method for Production of Lead Frame Substrate for LED Light Emitting Device 5

The lead frame substrate for an LED light emitting device 5 according to the present invention was produced by the following method.

First, a plate-like metal material made of a copper-chromium-tin alloy having a thickness of 0.5 mm was prepared and subjected to a degreasing washing treatment, and a negative-type photoresist of 8 µM was applied to the surface of the plate-like metal material and dried at 90° C. for 30 minutes to form a resist layer.

Next, in order to form a metal pattern for pad parts on which LED light emitting devices are to be mounted, lead parts that are electrically connected to the LED light emitting devices, tie bars and hanging leads for supporting the pad parts and lead parts, an outer frame part and the like, the photoresist layer was exposed through a photomask having a predetermined pattern by using an ultrahigh pressure mercury lamp at a light exposure amount of about 100 mJ/cm$^2$, and the photoresist layer was then subjected to a developing treatment by a 3% sodium carbonate aqueous solution. By this way, a resist pattern was formed on the part corresponding to the above-mentioned pattern, and the resist on other parts was removed.

In a similar way, a photoresist was also applied to the rear surface of the plate-like metal material to form a photoresist layer. The above-mentioned steps such as pattern light exposure, developing and the like were repeated.

At that time, different shapes of the patterns of the photomasks were used on the upper and rear surfaces to design the patterns so that three upper-rear electrode type LEDs were connected in series. The pattern of the first surface was disposed so that a part of the surfaces of the pad parts for mounting LED light emitting devices also served as the lead parts of the adjacent LED light emitting devices, and the rear surface was set so that only the terminal end parts of positive and negative electrodes were exposed and other pad parts (the parts also serving as the lead parts) were set to be half-etched. Furthermore, the hanging lead parts were set so that only the upper surface was half-etched.

Next, using a ferric chloride liquid having a specific gravity of 1.5, the exposed parts on the both surfaces of the plate-like metal material were removed at the same time by etching. By this way, a desired lead frame pattern having different shapes of the both surfaces was formed.

A resin molded body 11 was disposed on the obtained lead frame 50 by using a mold for filling that is not depicted, by using a solid tablet having a diameter of 18 mm and a length of 40 mm containing the silicon-containing curable composition shown in Example 30.

At that time, the resin was molded on the side of the surface for mounting LED light emitting devices so that the resin was present on the same plane as the surfaces of the pad parts and lead parts. On the other hand, on the rear surface, concave parts each having a depth of 0.05 μm were formed on the resin on only the pad parts and lead parts that were the positive and negative terminal ends, respectively, wherein the concave parts exposed the surfaces of the parts on the bottom surfaces.

The lead frame substrate was taken out from the mold and cured by heat at 130° C. for 1 hour.

In order to remove resin burr that had exuded on the surfaces of the pad parts and lead parts, electrolytic polishing was conducted by using an aqueous phosphoric acid solution for 30 minutes, and a treatment was then conducted by argon etching.

Thereafter, electrolysis nickel platings of 4 μm were provided to the surfaces of the pad parts and lead parts of the upper and rear surfaces by using 300 to 600 g/L of nickel sulfamate, 5 g/L of nickel chloride and 30 to 40 g/L of boric acid, a pH of 3.5 to 4.5, a temperature of 40 to 70° C. and an anode current density of 3 to 40 A/dm$^2$, and using a sulfamic acid bath that had been adjusted by Ni with S and a trace amount of surfactant in an anode, and using an electrolysis nickel plating of 4 μm on the whole surface of the lead frame, and electrolysis gold platings of 4 μm were provided similarly to the surfaces of the pad parts and lead parts on the upper and rear surfaces. No part on which the plating adhered was observed on the surfaces of the pad parts and lead parts, and thus homogeneous plating layers were formed. By this way, the lead frame substrate for an LED light emitting device of the present invention was completed.

Example 39

Production of LED Light Emitting Device Apparatus

LED light emitting device apparatuses using the lead frame substrates for LED light emitting devices according to the present invention were produced by the following method.

An electroconductive paste was applied to the pad parts 13 of each of the lead frame substrates for LED light emitting devices obtained in the above-mentioned Examples 34 to 38, and LED light emitting devices 20 were mounted thereon by a mounter and cured by heating at 180° C. for 30 minutes. Thereafter the LED light emitting devices 20 were joined to the lead parts 14 by gold wires 21 each having a diameter of 25 μM.

Next, a transparent resin for sealing kneaded with a phosphor was applied so as to seal the LED light emitting devices 20 and wires 21 by using a dispenser and cured in a clean oven to form a sealant resin 30, thereby an LED light emitting device apparatus was completed.

| REFERENCE SIGNS LIST | |
|---|---|
| 10 | Lead frame substrate for LED light emitting device |
| 11 | Resin molded body |
| 11b | First surface |
| 11c | Second surface |
| 12 | Concave part |
| 12a | Side surface |
| 12b | Bottom part |
| 13 | Pad part |
| 13a | Surface of pad part |
| 14 | Lead part |
| 14a | Surface of lead part |
| 16 | Tie bar |
| 17 | Hanging lead |
| 20 | LED light emitting device |
| 21 | Wire |
| 30 | Sealant resin |
| 41 | Substrate material |
| 41a | Resist |
| 42 | Resist pattern |
| 43 | Island part |
| 44 | Plating layer |
| 50 | Lead frame |
| A | LED light emitting device apparatus |

The invention claimed is:

1. A silicon-containing curable composition comprising:
as component (A), 100 parts by mass of a silicon-containing polymer having a weight average molecular weight of 3,000 to 100,000, which is obtainable by hydrolysis-condensation of an organosilane mixture comprising 5 to 50 mol % of one or more kind of (a) an organosilane represented by the following formula (1-1), 0 to 50 mol % of one or more kind of (b) an organosilane represented by the following formula (I-2), 0 to 40 mol % of one or more kind of (c) an organosilane represented by the following formula (1-3) and 0 to 50 mol % of one or more kind of (d) an organosilane represented by the following formula (1-4), wherein the total of the organosilane (b) and organosilane (c) is 5 to 60 mol %;
as component (B), greater than 0 to 200 parts by mass of a prepolymer comprising two or more Si—H groups in one molecule, which is obtainable by a hydrosilylation reaction of one or more kind selected from (α) a cyclic siloxane mer compound represented by the following formula (2) and one or more kind selected from (β) a compound represented by the following formula (3) or (3′);

as component (C), 0 to 30 parts by mass of a cyclic siloxane compound comprising two or more carbon-carbon double bonds having reactivity with Si—H groups in one molecule;

as component (D), 0.0001 to 10 parts by mass of an organic peroxide and 0 to 1.0 parts by mass of a metal catalyst, and as component (E), 10 to 1,500 parts by mass of a filler $$R^1SiX_3 \tag{1-1}$$

$$R^2SiX_3 \tag{1-2}$$

$$R^3R^4SiX_2 \tag{1-3}$$

$$R^5SiX_3 \tag{1-4}$$

wherein $R^1$ is an alkenyl group having 2 to 6 carbon atoms, $R^2$ is an alkyl group having 1 to 6 carbon atoms, and $R^3$ and $R^4$ are each independently an alkyl group having 1 to 6 carbon atoms, an alkenyl group having 2 to 6 carbon atoms or a phenyl group optionally substituted by an alkyl group having 1 to 6 carbon atoms, wherein at least one of $R^2$, $R^3$; and $R^4$ is a methyl group, $R^5$ is a phenyl group optionally substituted by an alkyl group having 1 to 6 carbon atoms, and X is a hydroxyl group, an alkoxy group having 1 to 6 carbon atoms or a halogen atom,

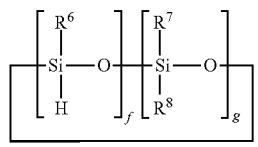

(2)

wherein in the formula (2), $R^6$, $R^7$ and $R^8$ each independently represents an alkyl group having 1 to 6 carbon atoms or a phenyl group optionally substituted by an alkyl group having 1 to 6 carbon atoms, wherein $R^6$s of a number of f may be the same or different and $R^7$s of a number of g and $R^8$s of a number of g each may also be the same or different, f represents a number of 2 to 10, g represents a number of 0 to 8, and f+g≥2,

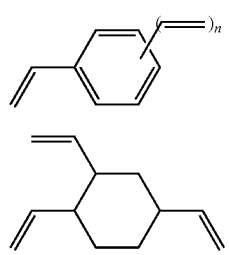

(3)

(3′)

wherein in the formula (3), n represents 1 or 2.

2. The silicon-containing curable composition according to claim 1, wherein $R^2$ is a methyl group in the formula (1-2), and $R^3$ and $R^4$ are phenyl groups optionally substituted by an alkyl group having 1 to 6 carbon atoms in the formula (1-3).

3. The silicon-containing curable composition according to claim 1, wherein $R^2$ is an alkyl group having 1 to 6 carbon atoms in the formula (1-2), and $R^3$ is an alkyl group having 1 to 6 carbon atoms and $R^4$ is a phenyl group optionally substituted by an alkyl group having 1 to 6 carbon atoms in the formula (1-3).

4. The silicon-containing curable composition according to claim 1, wherein the content of the component (B) with respect to 100 parts by mass of the component (A) is 10 to 200 parts by mass.

5. The silicon-containing curable composition according to claim 1, wherein the component (C) is a cyclic siloxane represented by the following formula (4)

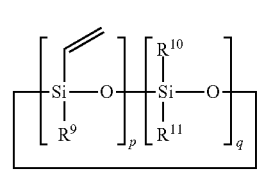

(4)

wherein in the formula (4), $R^9$, $R^{10}$ and $R^{11}$ each independently represents an alkyl group having 1 to 6 carbon atoms or a phenyl group optionally substituted by an alkyl group having 1 to 6 carbon atoms, wherein $R^9$s of a number of p may be the same or different, and $R^{10}$s of a number of q and $R^{11}$s of a number of q may also be the same or different, p represents a number of 2 to 10, q represents a number of 0 to 8, and p+q≥2.

6. A cured product obtainable by curing the silicon-containing curable composition according to claim 1.

7. A lead frame substrate for an LED light emitting device comprising a lead frame and a resin molded body, wherein the resin molded body is formed of the silicon-containing curable composition according to claim 1.

8. An LED light emitting device apparatus using the lead frame substrate for an LED light emitting device according to claim 7.

9. The silicon-containing curable composition according to claim 2, wherein the content of the component (B) with respect to 100 parts by mass of the component (A) is 10 to 200 parts by mass.

10. The silicon-containing curable composition according to claim 3, wherein the content of the component (B) with respect to 100 parts by mass of the component (A) is 10 to 200 parts by mass.

11. The silicon-containing curable composition according to claim 2, wherein the component (C) is a cyclic siloxane represented by the following formula (4)

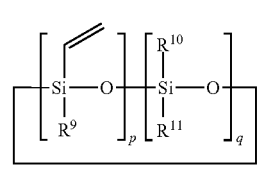

(4)

wherein in the formula (4), $R^9$, $R^{10}$ and $R^{11}$ each independently represents an alkyl group having 1 to 6 carbon atoms or a phenyl group optionally substituted by an alkyl group having 1 to 6 carbon atoms, wherein $R^9$s of a number of p may be the same or different, and $R^{10}$s of a number of q and $R^{11}$s of a number of q may also be the same or different, p represents a number of 2 to 10, q represents a number of 0 to 8, and p+q≥2.

12. The silicon-containing curable composition according to claim 3, wherein the component (C) is a cyclic siloxane represented by the following formula (4)

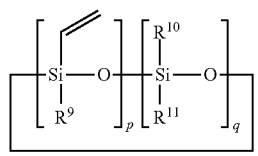
(4)

wherein in the formula (4), $R^9$, $R^{10}$ and $R^{11}$ each independently represents an alkyl group having 1 to 6 carbon atoms or a phenyl group optionally substituted by an alkyl group having 1 to 6 carbon atoms, wherein $R^9$s of a number of p may be the same or different, and $R^{10}$s of a number of q and $R^{11}$s of a number of q may also be the same or different, p represents a number of 2 to 10, q represents a number of 0 to 8, and p+q≥2.

13. The silicon-containing curable composition according to claim 4, wherein the component (C) is a cyclic siloxane represented by the following formula (4)

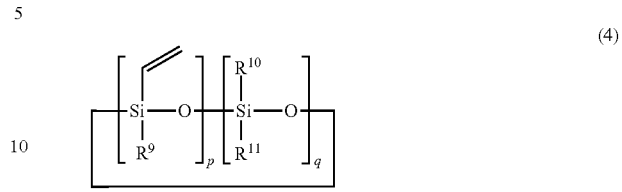
(4)

wherein in the formula (4), $R^9$, $R^{10}$ and $R^{11}$ each independently represents an alkyl group having 1 to 6 carbon atoms or a phenyl group optionally substituted by an alkyl group having 1 to 6 carbon atoms, wherein $R^9$s of a number of p may be the same or different, and $R^{10}$s of a number of q and $R^{11}$s of a number of q may also be the same or different, p represents a number of 2 to 10, q represents a number of 0 to 8, and p+q≥2.

* * * * *